(12) United States Patent
Tong et al.

(10) Patent No.: US 12,198,633 B2
(45) Date of Patent: Jan. 14, 2025

(54) DISPLAY PANEL, DISPLAY DEVICE, AND METHOD FOR MANUFACTURING DISPLAY PANEL

(71) Applicant: BOE Technology Group Co., Ltd., Beijing (CN)

(72) Inventors: Yue Tong, Beijing (CN); Yunke Qin, Beijing (CN); Lei Wang, Beijing (CN); Peng Jia, Beijing (CN); Xiaoquan Hai, Beijing (CN); Jiabin Wang, Beijing (CN); Fangyuan Zhao, Beijing (CN); Yangbing Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/795,444

(22) PCT Filed: Sep. 29, 2021

(86) PCT No.: PCT/CN2021/121559
§ 371 (c)(1),
(2) Date: Jul. 26, 2022

(87) PCT Pub. No.: WO2023/050115
PCT Pub. Date: Apr. 6, 2023

(65) Prior Publication Data
US 2024/0185792 A1 Jun. 6, 2024

(51) Int. Cl.
*G06V 40/13* (2022.01)
*G09G 3/3258* (2016.01)
(Continued)

(52) U.S. Cl.
CPC ....... *G09G 3/3258* (2013.01); *G06V 40/1318* (2022.01); *H10K 59/1201* (2023.02);
(Continued)

(58) Field of Classification Search
CPC ......... G09G 3/3258; G09G 2300/0852; G09G 2330/021; G09G 2360/14; G06V 40/1318;
(Continued)

(56) References Cited

U.S. PATENT DOCUMENTS 10,747,978 B2 8/2020 Ding et al.
11,387,290 B2 7/2022 Wang
(Continued)

FOREIGN PATENT DOCUMENTS

CN 107425038 A 12/2017
CN 109285870 A 1/2019
(Continued)

*Primary Examiner* — Stephen G Sherman
(74) *Attorney, Agent, or Firm* — WHDA, LLP

(57) ABSTRACT

A display panel is provided, including: a base substrate; a pixel circuit on the base substrate, the pixel circuit includes a transistor including an active layer, a gate electrode, a first electrode and a second electrode; and a fingerprint recognition circuit including a photosensitive circuit, a storage circuit and an output circuit, the storage circuit includes a first capacitor including a first capacitance electrode and a second capacitance electrode; the first capacitance electrode is arranged in the same layer as at least one of the gate electrode, the active layer, the first capacitor or the second electrode, and/or, the second capacitance electrode is arranged in the same layer as at least one of the gate electrode, the active layer, the first electrode or the second electrode; the first capacitance electrode is located in a layer different from a layer where the second capacitance electrode is located.

17 Claims, 13 Drawing Sheets

(51) Int. Cl.
  *H10K 59/12*   (2023.01)
  *H10K 59/121*  (2023.01)
  *H10K 59/65*   (2023.01)

(52) U.S. Cl.
  CPC ......... *H10K 59/1213* (2023.02); *H10K 59/65* (2023.02); *G09G 2300/0852* (2013.01); *G09G 2330/021* (2013.01); *G09G 2360/14* (2013.01)

(58) Field of Classification Search
  CPC . H10K 59/1201; H10K 59/65; H10K 59/1213
  See application file for complete search history.

(56) References Cited

U.S. PATENT DOCUMENTS

| | | |
|---|---|---|
| 11,543,904 B2 | 1/2023 | Bok et al. |
| 2018/0053032 A1 | 2/2018 | Ding et al. |
| 2021/0098504 A1* | 4/2021 | Zhuang ............... H01L 27/1222 |
| 2021/0167229 A1 | 6/2021 | Lee et al. |
| 2021/0200366 A1 | 7/2021 | Bok et al. |
| 2021/0200980 A1* | 7/2021 | Xu ..................... G06V 40/1318 |
| 2021/0305521 A1* | 9/2021 | Han ..................... H10K 77/111 |
| 2021/0335917 A1 | 10/2021 | Wang |
| 2021/0408088 A1* | 12/2021 | Ban ..................... H01L 27/1214 |

FOREIGN PATENT DOCUMENTS

| | | |
|---|---|---|
| CN | 110808272 A | 2/2020 |
| CN | 111509010 A | 8/2020 |
| CN | 112909030 A | 6/2021 |
| CN | 113066833 A | 7/2021 |
| CN | 113130602 A | 7/2021 |
| WO | 2021/056730 A1 | 4/2021 |

\* cited by examiner

DISPLAY PANEL, DISPLAY DEVICE, AND METHOD FOR MANUFACTURING DISPLAY PANEL

CROSS REFERENCE TO RELATED APPLICATION

This application is a Section 371 National Stage Application of International Application No. PCT/CN2021/121559, filed on Sep. 29, 2021, entitled "DISPLAY PANEL, DISPLAY DEVICE, AND METHOD FOR MANUFACTURING DISPLAY PANEL".

TECHNICAL FIELD

The present disclosure relates to a field of display technology, and in particular to a display panel, a display device, and a method for manufacturing a display panel.

BACKGROUND

Organic Light Emitting Diode (OLED) display technology is gradually being widely used and has become the most potential display technology to replace Liquid Crystal Display (LCD). Compared with an LCD display technology, the OLED display technology provides a better experience in terms of picture quality, response speed, lightness, etc. The OLED display technology also has an advantage of high transmittance of a display screen, making it possible for a below-cell fingerprint recognition and an in-cell fingerprint recognition.

One of key difficulties of an in-cell fingerprint recognition technology is anti-strong light. A sensor may not distinguish a difference between signals corresponding to a valley and a ridge of a finger under strong light, resulting in a failure of the sensor.

SUMMARY

In view of this, embodiments of the present disclosure provide a display panel, a display device, and a method for manufacturing a display panel, which are used to meet requirements of the in-cell fingerprint recognition under strong light.

In an aspect, the embodiments of the present disclosure provide a display panel, including: a base substrate; a pixel circuit arranged on the base substrate, wherein the pixel circuit includes a transistor, and the transistor of the pixel circuit includes an active layer, a gate electrode, a first electrode and a second electrode; and a fingerprint recognition circuit, wherein the fingerprint recognition circuit includes a photosensitive circuit, a storage circuit and an output circuit, the storage circuit includes a first capacitor, and the first capacitor includes a first capacitance electrode and a second capacitance electrode; wherein the photosensitive circuit is configured to convert a received optical signal into an electrical signal, the storage circuit is configured to store the electrical signal, and the output circuit includes a control switch configured to control the photosensitive circuit to charge the storage circuit in an off state and output at least the stored electrical signal in a closed state, so as to perform a fingerprint recognition based on the output electrical signal; wherein the first capacitance electrode is arranged in the same layer as at least one of the gate electrode, the active layer, the first electrode or the second electrode, and/or, the second capacitance electrode is arranged in the same layer as at least one of the gate electrode, the active layer, the first electrode or the second electrode; the first capacitance electrode is located in a layer different from a layer where the second capacitance electrode is located, and an orthographic projection of the first capacitance electrode on the base substrate at least partially overlaps with an orthographic projection of the second capacitance electrode on the base substrate.

In some embodiments, the gate electrode includes a first gate line and a second gate line, and the first gate line is located in a layer different from a layer where the second gate line is located; and the first capacitance electrode is arranged in the same layer as the first gate line or the second gate line, and the second capacitance electrode is arranged in the same layer as the first gate line or the second gate line.

In some embodiments, the above-mentioned display panel further includes: a first gate dielectric layer arranged between the active layer and the first gate line; a second gate dielectric layer arranged between the first gate line and the second gate line; and an interlayer dielectric layer arranged on a side of the second gate dielectric layer away from the base substrate.

In some embodiments, the first capacitance electrode is connected to the first electrode through a first via hole, and the first via hole is arranged in the second gate dielectric layer and the interlayer dielectric layer; or the second capacitance electrode is connected to the first electrode through a second via hole, the second via hole is arranged in the interlayer dielectric layer, and the second via hole exposes the second capacitance electrode.

In some embodiments, the gate electrode includes a first gate line and a second gate line, and the first gate line is located in a layer different from a layer where the second gate line is located; and the first capacitance electrode is arranged in the same layer as the first gate line or the second gate line, and the second capacitance electrode is arranged in the same layer as the active layer.

In some embodiments, the first capacitance electrode is arranged in the same layer as at least one of the gate electrode, the active layer or the first electrode, the second capacitance electrode is arranged on a first metal layer, and the first metal layer is located in a layer different from a layer where the gate electrode, the active layer and the first electrode are respectively located; or the second capacitance electrode is arranged in the same layer as at least one of the gate electrode, the active layer or the first electrode, the first capacitance electrode is arranged on a second metal layer, and the second metal layer is located in a layer different from a layer where the gate electrode, the active layer and the first electrode are respectively located.

In some embodiments, the first capacitance electrode is arranged in the same layer as the first electrode, the second capacitance electrode is arranged on a side of the photosensitive circuit away from the base substrate, and a distance exists between the orthographic projection of the second capacitance electrode on the base substrate and an orthographic projection of the photosensitive circuit on the base substrate.

In some embodiments, the above-mentioned display panel further includes: an interlayer dielectric layer arranged on a side of the gate electrode away from the base substrate; and an insulating layer, wherein a first thickness of the insulating layer is greater than a second thickness of the interlayer dielectric layer; wherein the first electrode includes: a first sub-electrode arranged on a side of the interlayer dielectric layer away from the base substrate; and a second sub-electrode arranged on a side of the first sub-electrode away from the base substrate, wherein the insulating layer is arranged between the first sub-electrode and the second sub-electrode; and wherein the photosensitive circuit is arranged on a side of the second sub-electrode away from the base substrate.

In some embodiments, the storage circuit further includes at least one second capacitor connected in parallel with the first capacitor, and each of the at least one second capacitor includes a third electrode and a fourth electrode.

In some embodiments, the third electrode is arranged in the same layer as at least one of the gate electrode, the active layer or the first electrode, and the fourth electrode is arranged in the same layer as at least one of the gate electrode, the active layer or the first electrode; the third electrode is located in a layer different from a layer where the fourth electrode is located, and an orthographic projection of the third electrode on the base substrate at least partially overlaps with an orthographic projection of the fourth electrode on the base substrate.

In some embodiments, the third electrode is arranged in the same layer as at least one of the gate electrode, the active layer or the first electrode, the fourth electrode is arranged in a third metal layer, and the third metal layer is located in a layer different from a layer where the gate electrode, the active layer and the first electrode are respectively located; or the fourth electrode is arranged in the same layer as at least one of the gate electrode, the active layer or the first electrode, the fourth electrode is arranged in a fourth metal layer, and the fourth metal layer is located in a layer different from a layer where the gate electrode, the active layer and the first electrode are respectively located.

In some embodiments, the gate electrode includes a first gate line and a second gate line, and the first gate line is located in a layer different from a layer where the second gate line is located; the third gate line is arranged in the same layer as the first gate line or the second gate line, the fourth electrode is arranged in the same layer as the first gate line or the second gate line, and the third electrode is located in a layer different from a layer where the fourth electrode is located.

In some embodiments, the above-mentioned display panel further includes: a plurality of pixel units arranged on the base substrate, wherein the plurality of pixel units are arranged on the base substrate in an array, and an orthographic projection of the pixel units on the base substrate overlaps with an orthographic projection of the photosensitive circuit on the base substrate.

In some embodiments, the pixel unit include at least one sub-pixel, each sub-pixel includes a light-emitting element, and the light-emitting element includes an anode; and the pixel circuit includes a sub-pixel drive circuit, and a first electrode of a transistor of the sub-pixel drive circuit is connected to the anode.

In some embodiments, the output circuit includes a first transistor, and the sub-pixel drive circuit includes at least one second transistor; wherein a first electrode of the first transistor is arranged in the same layer as a first electrode of the second transistor; and/or a gate electrode of the first transistor is arranged in the same layer as a gate electrode of the second transistor; and/or an active layer of the first transistor is arranged in the same layer as an active layer of the second transistor.

In some embodiments, the photosensitive circuit includes a PIN photodiode.

In some embodiments, the above-mentioned display panel further includes: a transparent conductive layer arranged on a side of the PIN photodiode away from the base substrate, wherein the transparent conductive layer is connected to a bias voltage lead-in electrode.

On the other hand, the embodiments of the present disclosure provide a display device. The display device includes: the display panel according to any of the above-mentioned embodiments.

On the other hand, the embodiments of the present disclosure provide a method for manufacturing a display panel, including: providing a base substrate; arranging a pixel circuit on the base substrate, wherein the pixel circuit includes a gate electrode, an active layer, a first electrode and a second electrode; arranging a fingerprint recognition circuit; wherein the fingerprint recognition circuit includes a photosensitive circuit, a storage circuit and an output circuit, the storage circuit includes a first capacitor, and the first capacitor includes a first capacitance electrode and a second capacitance electrode; a transistor of the output circuit is arranged in the same layer as a transistor of the pixel circuit; wherein the photosensitive circuit is configured to convert a received optical signal into an electrical signal, the storage circuit is configured to store the electrical signal, and the output circuit includes a control switch configured to control the photosensitive circuit to charge the storage circuit in an off state and output at least the stored electrical signal in a closed state, so as to perform a fingerprint recognition based on the output electrical signal; wherein the first capacitance electrode is arranged in the same layer as at least one of the gate electrode, the active layer, the first electrode or the second electrode, and/or, the second capacitance electrode is arranged in the same layer as at least one of the gate electrode, the active layer, the first electrode or the second electrode; the first capacitance electrode is located in a layer different from a layer where the second capacitance electrode is located, and an orthographic projection of the first capacitance electrode on the base substrate at least partially overlaps with an orthographic projection of the second capacitance electrode on the base substrate.

In some embodiments, the first capacitance electrode and the second capacitance electrode are manufactured by: forming a fifth metal layer, and patterning the fifth metal layer to form the first capacitance electrode and a first gate line; forming a second gate dielectric layer; forming a sixth metal layer, and patterning the sixth metal layer to form the second capacitance electrode and a second gate line; wherein a first width of a cross section of the first capacitance electrode perpendicular to an extension direction of the first gate line is greater than a second width of a cross section of the second capacitance electrode perpendicular to an extension direction of the second gate line; forming an interlayer dielectric layer, and forming a via hole in a region where a projection of the first capacitance electrode on the base substrate and a projection of the second capacitance electrode on the base substrate do not overlap, so as to expose the first capacitance electrode; and forming the first electrode so that the first capacitance electrode and the first electrode are electrically connected.

In some embodiments, the first capacitance electrode and the second capacitance electrode are manufactured by: forming the active layer; patterning the active layer to form a patterned active layer, wherein the patterned active layer includes a first pattern region and a second pattern region electrically connected, the first pattern region corresponds to an active layer of the transistor of the output circuit, and the second pattern region corresponding to the first capacitance electrode; sequentially forming a first gate dielectric layer, a first gate line, a second gate dielectric layer and a seventh metal layer; and patterning the seventh metal layer to form the second capacitance electrode and a second gate line.

In some embodiments, the first capacitance electrode and the second capacitance electrode are manufactured by: forming an eighth metal layer; patterning the eighth metal layer to form a patterned eighth metal layer, wherein the patterned eighth metal layer includes a third pattern region and a fourth pattern region electrically connected, the third pattern region corresponds to a first electrode of the transistor of the output circuit, and the fourth pattern region corresponds to the first capacitance electrode; sequentially forming a photosensitive circuit, a dielectric layer and a ninth metal layer; and patterning the ninth metal layer to form the second capacitance electrode.

In some embodiments, the method for manufacturing a display panel further includes: forming at least one second capacitor connected in parallel with the first capacitor, wherein each of the at least one second capacitor includes a third electrode and a fourth electrode; a manufacturing method of the third electrode and the fourth electrode is the same as that of the first capacitance electrode and the second capacitance electrode.

BRIEF DESCRIPTION OF DRAWINGS

In order to illustrate the technical solutions of the embodiments of the present disclosure more clearly, the accompanying drawings of the embodiments will be briefly described below. It should be understood that the accompanying drawings described below only relate to some embodiments of the present disclosure, and are not intended to limit the present disclosure.

DETAILED DESCRIPTION

Figure 1:
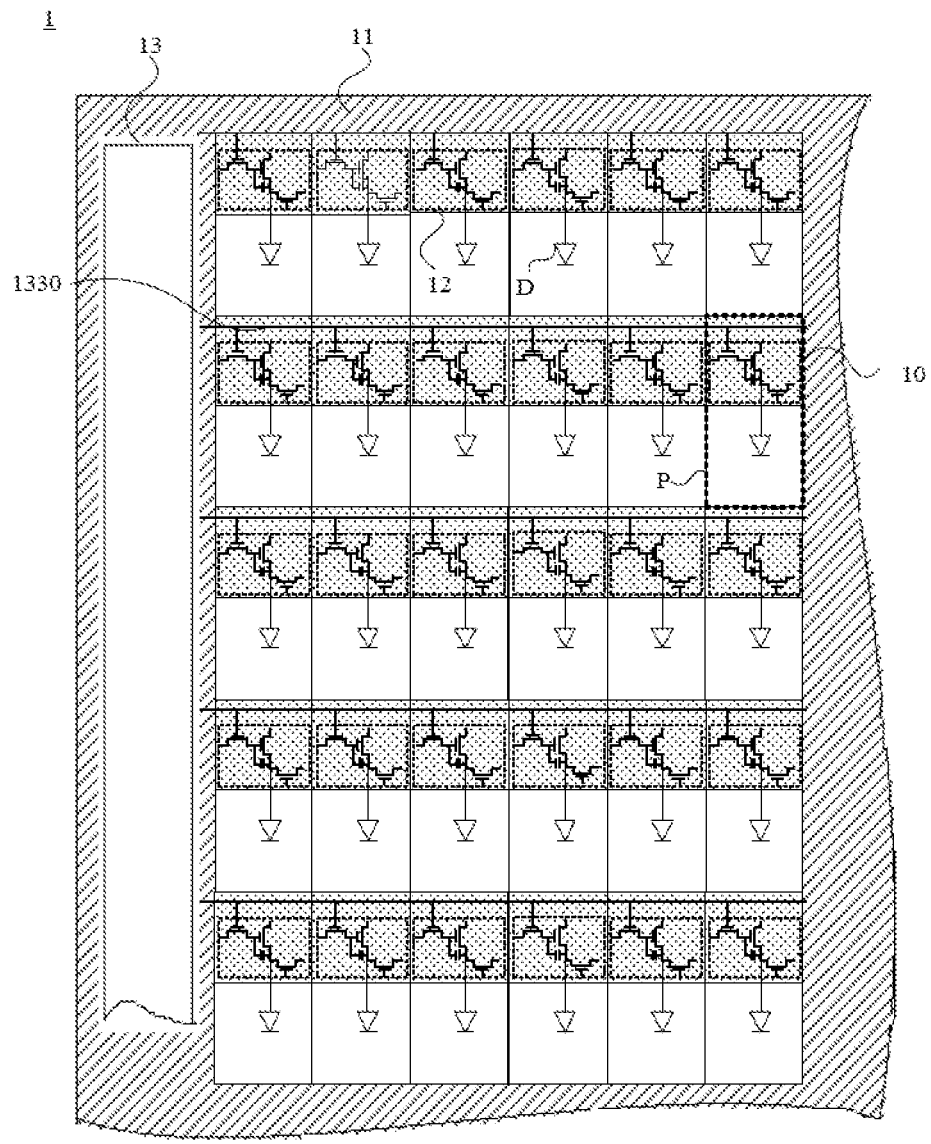
FIG. 1 is a structural diagram of a display panel according to an embodiment of the present disclosure.

In order to more clearly illustrate the objectives, technical solutions and advantages of the present disclosure, the embodiments of the present disclosure will be described in detail below with reference to the accompanying drawings. It should be understood that the following description of the embodiments is intended to explain and illustrate the general concept of the present disclosure, and should not be construed as limiting the present disclosure. In the specification and accompanying drawings, the same or similar reference numerals refer to the same or similar parts or components. For the purpose of clarity, the accompanying drawings are not necessarily to scale, and some well-known components and structures may be omitted from the accompanying drawings.

Unless otherwise defined, technical or scientific terms used in the present disclosure shall have ordinary meanings as understood by those skilled in the art to which the present disclosure belongs. As used in the present disclosure, "first," "second," and similar terms do not denote any order, quantity, or importance, but are merely used to distinguish different components. "Including" or "containing" and similar words mean that elements or things preceding the word cover elements or things following the word and their equivalents, and do not exclude other elements or things. "Connected" or "linked" and similar words are not limited to a physical or mechanical connection, but may include an electrical connection in a direct or indirect manner. "Up", "down", "left", "right", "top" or "bottom", etc. are only used to indicate relative positional relationships. When an absolute position of a described object changes, the relative positional relationship may also change correspondingly. When an element such as a layer, film, region, or substrate is referred to as being "on" or "under" another element, the element may be "directly" located "on" or "under" the other element, or there may be an intermediate element.

The technical solutions of some embodiments of the present disclosure will be clearly and completely described below with reference to the accompanying drawings. Obviously, the described embodiments are only some, but not all of the embodiments of the present disclosure. Based on the embodiments provided by the present disclosure, all other embodiments obtained by those skilled in the art fall within the scope of protection of the present disclosure.

Unless otherwise required in the context, throughout the specification and claims, the term "comprise" and other forms thereof such as a singular form in third personal "comprises" and a present participle form "comprising" are interpreted as the meaning of openness and inclusion, i.e., "including, but not limited to". In the description of the specification, the terms "one embodiment", "some embodiments", "exemplary embodiments", "example", "specific example" or "some examples", etc. are intended to indicate that particular features, structures, materials or characteristics related to the embodiment or example are included in at least one embodiment or example of the present disclosure. The schematic representations of the above-mentioned terms do not necessarily refer to the same embodiment or example. In addition, the particular features, structures, materials, or characteristics may be included in any one or more embodiments or examples in any suitable manner.

After that, the terms "first" and "second" are only used for descriptive purposes, and should not be construed as indicating or implying a relative importance or implicitly indicating the number of indicated technical features. Thus, a feature defined by "first" or "second" may expressly or implicitly includes one or more of the features. In the description of the embodiments of the present disclosure, unless otherwise specified, "plurality" means two or more.

When some embodiments are described, the expressions "coupled" and "connected" and derivatives thereof may be used. For example, when some embodiments are described, the term "connected" may be used to indicate that two or more components are in direct physical or electrical contact with each other. As another example, when some embodiments are described, the term "coupled" may be used to indicate that two or more components are in direct physical or electrical contact. However, the terms "coupled" or "communicatively coupled" may also mean that two or more components are not in direct contact with each other, but yet still co-operate or interact with each other. The embodiments disclosed herein are not necessarily limited to he present disclosure.

"At least one of A, B, and C" has the same meaning as "at least one of A, B, or C", and both include following combinations of A, B, and C: A only, B only, C only, a combination of A and B, a combination of A and C, a combination of B and C, and a combination of A, B and C.

"A and/or B" includes following three combinations: A only, B only, and a combination of A and B.

As used herein, the term "if" is optionally construed as meaning "when" or "at the time of . . . " or "in response to determining" or "in response to detecting" according to the context. Similarly, according to the context, the phrase "if it is determined that . . . " or "if [the stated condition or event] is detected" is optionally construed as meaning "at the time of determining . . . " or "in response to determining . . . " or "at the time of detecting [the stated condition or event]" or "in response to detecting [the stated condition or event]".

The use of "adapted to" or "configured to" herein means an open and inclusive language that does not preclude devices adapted or configured to perform additional tasks or steps.

In addition, the use of "based on" means to be open and inclusive, because a process, step, calculation or other action "based on" one or more conditions or values may in practice be based on additional conditions or values beyond.

As used herein, "about" or "approximately" includes the stated value as well as an average value within an acceptable deviation range of a specified value. The acceptable deviation range may be determined, for example, by those skilled in the art by taking into account the measurement in question and errors (i.e., limitations of a measurement system) associated with the measurement of a particular quantity.

As used herein, the same reference numerals may refer to both a signal line and a signal terminal and signals corresponding to the signal line and the signal terminal.

Exemplary embodiments are described herein with reference to cross-sectional and/or plan design views that are idealized exemplary accompanying drawings. In the accompanying drawings, a thickness of a layer and region may be enlarged for clarity. Thus, variations from the shapes of the accompanying drawings due to, for example, manufacturing techniques and/or tolerances, are contemplated. Therefore, exemplary embodiments should not be construed as being limited to a shape of a region shown herein, but to include shape deviations caused by, for example, manufacturing. For example, an etched region shown as a rectangle may typically have a curved feature. Therefore, regions showed in the accompanying drawings are schematic in nature and shapes thereof are not intended to illustrate an actual shape of a region of a device and are not intended to limit the scope of the exemplary embodiments.

The embodiments of the present disclosure provide a display device, which may be, for example, any one of an OLED display device and a QLED (Quantum Dot light-emitting Diodes) display device.

The structure of the display device will be introduced below by taking the display device as an OLED display device as an example.

FIG. 1 is a structural diagram of a display panel according to an embodiment of the present disclosure.

As shown in FIG. 1, the display panel 1 includes a display region 10 and a non-display region 11 located at a periphery of the display region 10. The display region 10 is arranged with a plurality of pixel units distributed in an array, and each pixel unit may include one or more sub-pixels P. Each sub-pixel P is arranged with a pixel drive circuit 12 and a light-emitting device D coupled to the pixel drive circuit 12. The non-display region 11 is arranged with a gate electrode drive circuit 13, an output end of the gate electrode drive circuit 13 is coupled to a gate line 1330, and the pixel drive circuits 12 in the same row are coupled to the same gate line 1330. In the display panel 1, since all thin film transistors in the gate electrode drive circuit 13 are located in the non-display region 11, a larger area is occupied in the non-display region 11, which may lead to a larger area of the non-display region 11, for example, both length and width are long.

Figure 2:
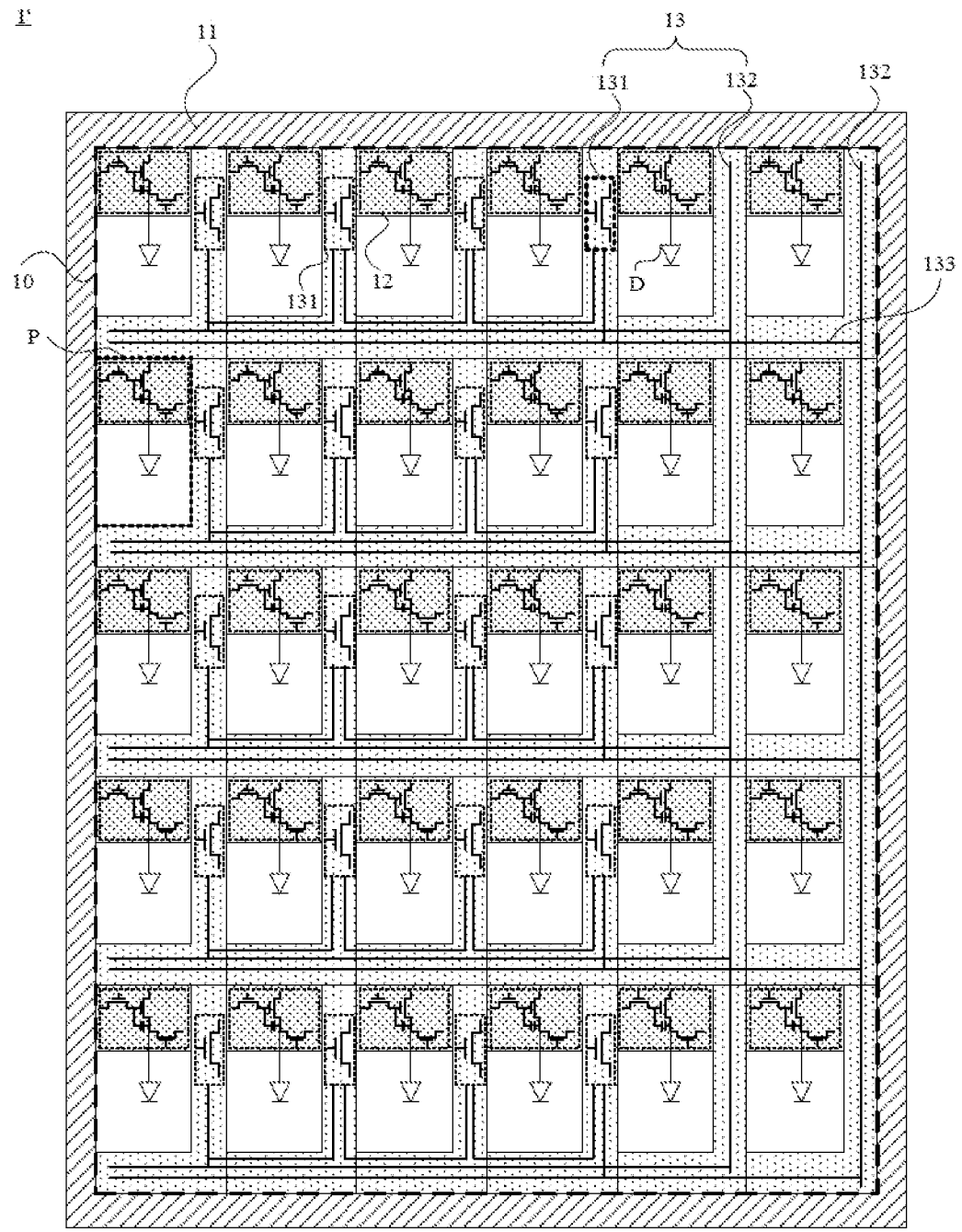
FIG. 2 is a structural diagram of a display panel according to another embodiment of the present disclosure.

FIG. 2 is a structural diagram of a display panel according to another embodiment of the present disclosure.

As shown in FIG. 2, the display panel 1' has a display region 10 and a non-display region 11. The non-display region 11 is arranged, for example, around the display region 10.

The display panel 1' includes: a base substrate, a plurality of pixel units arranged on the base substrate, and a gate electrode drive circuit 13. Each pixel unit may include one or more sub-pixels P. A plurality of pixel units are arranged on the base substrate, each pixel unit includes at least one sub-pixel P, and each sub-pixel P includes a light-emitting element D located in a light-emitting region and a pixel drive circuit 12 located in a non-light-emitting region.

The gate electrode drive circuit 13 includes a plurality of cascaded shift registers and a plurality of gate lines. A shift register is coupled to a plurality of pixel drive circuits 12 in at least one row of pixel units through at least one gate line, and the shift register is used to provide a gate drive signal to the plurality of pixel drive circuits 12 through at least one gate line.

The pixel drive circuit 12 may be, for example, a 2T1C type pixel drive circuit, or a 3T1C type pixel drive circuit, or a 7T1C type pixel drive circuit. T represents a thin-film transistor (TFT), C represents a storage capacitor, and 2T1C type is the pixel drive circuit 12 including 2 TFTs and 1 storage capacitor, and so on.

In FIG. 2, at least one first thin film transistor group 131 is located in the display region 10 and distributed between adjacent sub-pixels P in the same row of sub-pixels. Each first thin film transistor group 131 includes, for example, a first thin film transistor.

In FIG. 2, all the first thin film transistor groups 131 included in the gate electrode drive circuit 13 are located in the display region 10, and the first thin film transistor groups 131 included in each stage of the shift register are distributed in a region between adjacent sub-pixels P in the same row of sub-pixels P.

A material of a control signal line 132 or a connection line 133 is, for example, a metal material, such as molybdenum (Mo), titanium (Ti), copper (Cu), silver (Ag), and aluminum (Al). The control signal line may be a metal laminated structure, which is not limited in the present disclosure.

In some embodiments, light emitted by the light-emitting device D is emitted toward a side away from the base substrate. The display panel 1' of the structure is a top-emission type display panel. In the top-emission type display panel, an orthographic projection of a portion of the gate electrode drive circuit 13 located in the display region 10 on the base substrate may overlap with an orthographic projection of the light-emitting device D on the base substrate, which may not affect an opening ratio of the display panel 1'.

Figure 10:
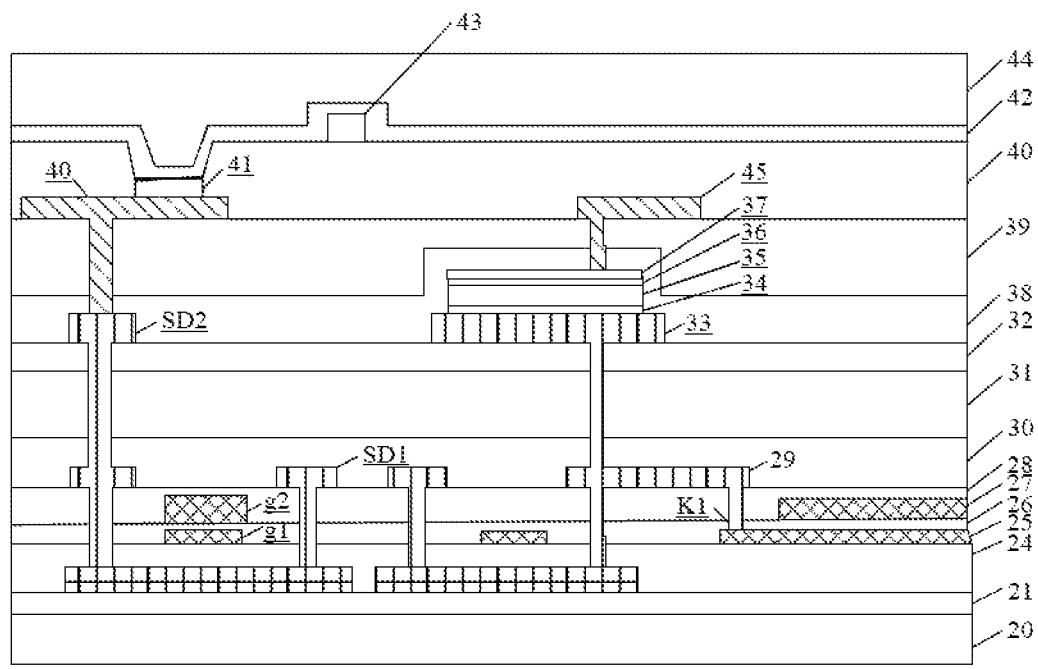
FIG. 10 is a schematic structural diagram of a display panel according to an embodiment of the present disclosure.

Regardless of whether the display panel 1' is a bottom-emission type display panel or a top-emission type display panel, the structure of the display panel 1' is, for example, as shown in FIG. 10. In a thickness direction of the display panel 1', the display panel 1' may include a light shielding layer, a buffer layer, a thin film transistor, an anode and a flat layer, etc. arranged on the base substrate. The thin film transistor is a drive transistor T3 in the pixel drive circuit 12, and the thin film transistor includes, for example, a first active layer, a first gate insulating layer, a gate electrode, an interlayer insulating layer, an SD layer (source/drain layer), and a passivation layer.

The display panel 1' may also include a light shielding layer. A material of the light shielding layer is, for example, a light shielding material. The light shielding material is, for example, a black matrix material, or a metal material. In FIG. 10, taking the metal material as an example, the light shielding layer needs to be coupled with the SD layer to form a structure similar to upper and lower double channels, thereby improving electrical performances of the thin film transistor. The light shielding layer is configured to prevent light incident from the base substrate from affecting the first active layer, thereby affecting performances of the thin film transistor.

A material of the first active layer may be, for example, metal oxide, polycrystalline silicon, or amorphous silicon; the metal oxide may be, for example, indium gallium zinc oxide.

A material of the gate electrode may be, for example, a metal material, such as tungsten, molybdenum, titanium, copper, silver, and aluminum, and a structure thereof is, for example, a single-layer structure.

A material of the SD layer may be, for example, a metal material, such as tungsten, molybdenum, titanium, copper, silver, aluminum and other metal materials, and a structure thereof may be a single-layer structure or a laminated structure.

Materials of the buffer layer, the first gate insulating layer, the interlayer insulating layer and the passivation layer are, for example, all inorganic insulating materials. For example, the inorganic insulating materials include, but are not limited to, at least one of silicon oxide (SiOx) or silicon nitride (SiN).

A material of the anode is, for example, a conductive material, such as indium tin oxide (ITO), which may has a single-layer structure or a laminated structure.

A material of the flat layer is, for example, an organic substance, such as polyimide (PI), and the flattening layer plays a flattening role.

Figure 3:
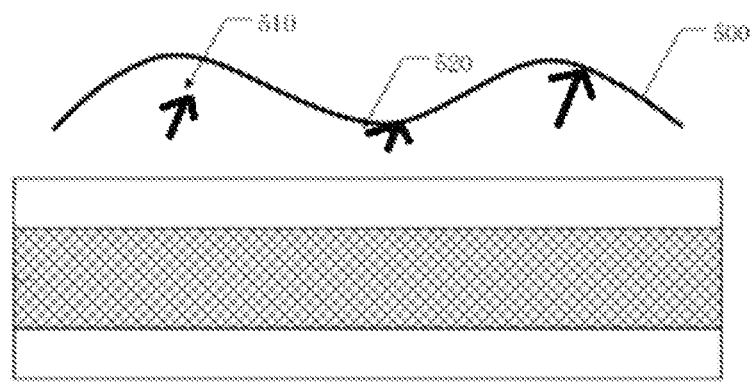
FIG. 3 and FIG. 4 are working principle diagrams of a fingerprint sensor according to an embodiment of the present disclosure.
Figure 4:
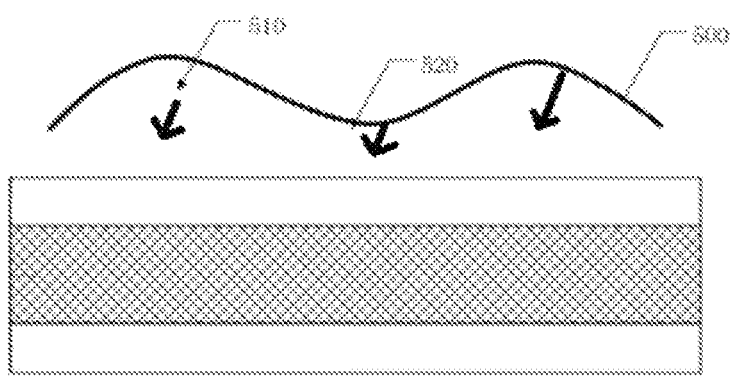

FIG. 3 and FIG. 4 are working principle diagrams of a fingerprint sensor according to an embodiment of the present disclosure.

As shown in FIG. 3 and FIG. 4, light incident on a fingerprint 500 is reflected by the fingerprint 500, and the reflected light is converted into an electrical signal in a photosensitive unit. At this time, a lead-out electrode connected with the photosensitive unit may be used as a receiving electrode to receive the electrical signal generated by the photosensitive unit. Since the fingerprint 500 includes a valley 510 and a ridge 520 which have different reflection capabilities for light (the valley 510 has a stronger reflection capability for light), resulting in different intensities of light reflected by the valley 510 and the ridge 520. Therefore, it may be determined whether the light is reflected by the valley or the ridge through an electrical signal received by the receiving electrode.

Figure 5:
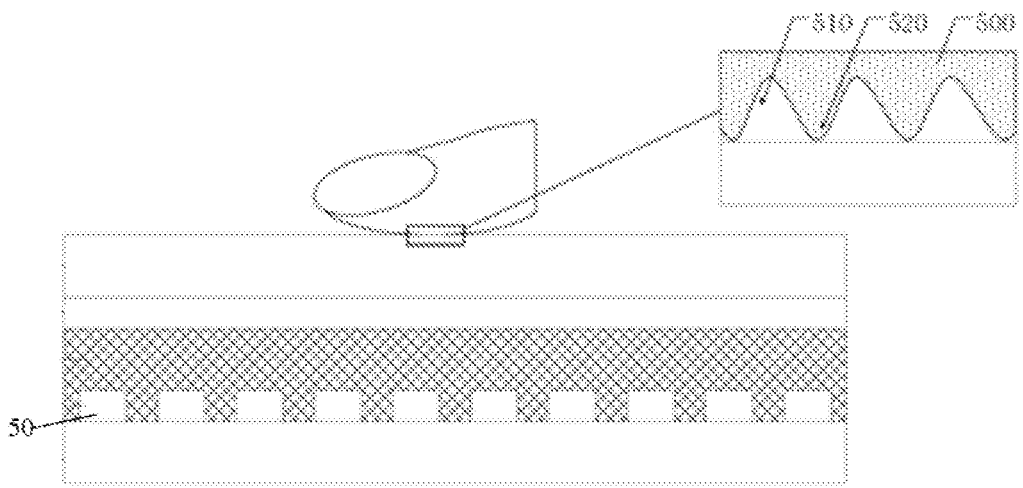
FIG. 5 is a schematic diagram of a fingerprint recognition in a display panel according to some embodiments of the present disclosure.

FIG. 5 is a schematic diagram of a fingerprint recognition circuit in a display panel according to some embodiments of the present disclosure. As shown in FIG. 5, the fingerprint recognition structure includes a plurality of photosensitive units 50. When a fingerprint is in contact with a substrate, light is reflected by the fingerprint 500, and the reflected light is converted into an electrical signal in the photosensitive unit 50. At this time, a receiving electrode receives the electrical signal, so as to receive electrical signals generated by the photosensitive unit 50 at different positions.

Figure 6:
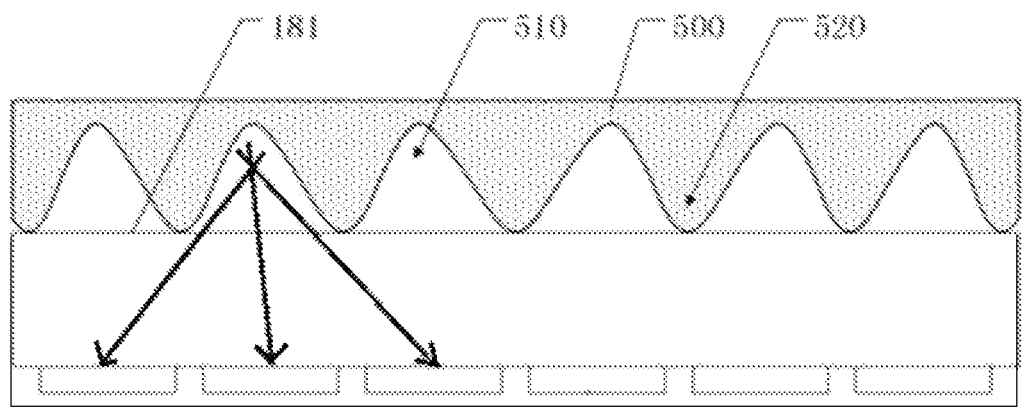
FIG. 6 and FIG. 7 are schematic diagrams of light reflected from a fingerprint valley and a fingerprint ridge of a fingerprint sensor in FIG. 5 according to some embodiments of the present disclosure.
Figure 7:
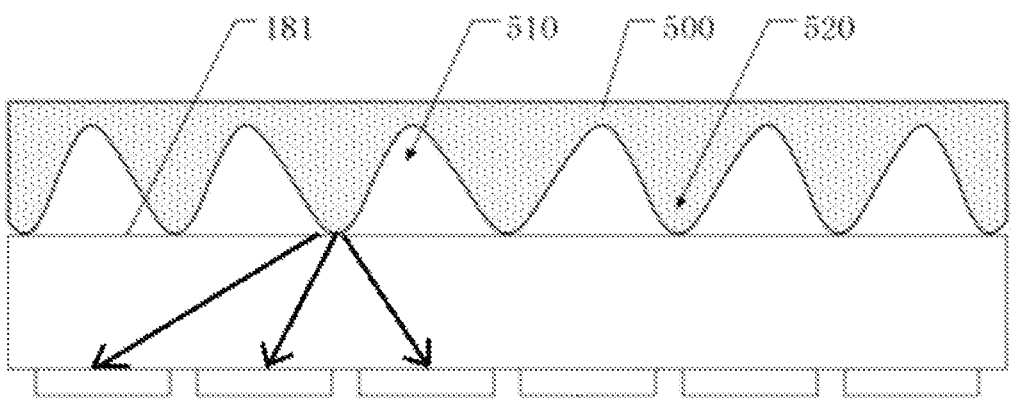

FIG. 6 and FIG. 7 are schematic diagrams of light reflected by a fingerprint valley and a fingerprint ridge of a fingerprint sensor in FIG. 5 according to some embodiments of the present disclosure.

As shown in FIG. 6 and FIG. 7, since the fingerprint 500 includes a valley 510 and a ridge 520 which have different reflection capabilities for light (for example, the valley 510 has a stronger reflection capability for light), resulting in different intensities of light reflected by the valley 510 and the ridge 520. Therefore, position information of the valley and the ridge in the fingerprint 500 may be obtained through electrical signals received by receiving electrodes coupled with sensitive units 10 at different positions, so that a fingerprint recognition may be achieved. In addition, at a surface 181 where the display panel is in contact with a user's finger, the ridge 520 may be in contact with the surface 181, and there is air between the valley 510 and the surface 181, which may result in different refractive indices for paths of light rays reflected from the valley 510 and the ridge 520 and may also affect an intensity of light reflected back by the valley 510 and the ridge 520.

Specifically, when incident light reaches the valley 510 of the fingerprint 500, light reflected by the valley 510 has a greater energy or intensity. When incident light reaches the ridge 520 of the fingerprint 500, light reflected by the ridge 520 has a less energy or intensity. Therefore, there is a large difference between the intensities and energies of the light reflected by the valley 510 and the ridge 520 of the fingerprint 500. Based on the difference, whether the current position is a valley or a ridge may be determined, and the position information of the valley and the ridge in the fingerprint 500 may be obtained.

The present disclosure relates to a field of sensing technology. Based on a pixel structure, pixel circuit, and process structure of an OLED display screen, a pixel circuit structure is proposed to improve an in-cell integrated fingerprint sensor of the OLED display screen, improve an anti-strong light capability and improve an SNR signal-to-noise ratio. On this basis, the present disclosure further provides two process implementations to solve a technical problem of saturation of a fingerprint recognition of an in-cell fingerprint recognition technology under strong light.

Fingerprint recognition function has become a standard feature of a mobile phone. Fingerprint recognition technology is divided into a below-cell fingerprint recognition and an in-cell fingerprint recognition. The below-cell fingerprint recognition is achieved by pasting a module of a fingerprint recognition sensor below a screen. The in-cell fingerprint recognition is achieved by integrating the fingerprint recognition sensor directly into a display screen. Therefore, the in-cell fingerprint recognition may make the phone thinner and lighter. As flagship mobile phones gradually develop towards a curved screen and folding screen, the OLED display screen has also become a choice of most flagship phones. Therefore, an OLED screen combined with an in-cell fingerprint recognition technology is an important research direction for mobile phone identification and unlocking in the future.

A principle of the in-cell fingerprint recognition is to add a fingerprint recognition circuit of the fingerprint recognition sensor inside an OLED pixel. Since a sensor for a fingerprint recognition is integrated in a pixel circuit of the OLED, the pixel circuit may also be called a sensor pixel circuit, or simply a pixel circuit, which is a different concept from that of a pixel circuit (used to drive an organic light-emitting diode to emit light) of the OLED display screen.

Figure 8:
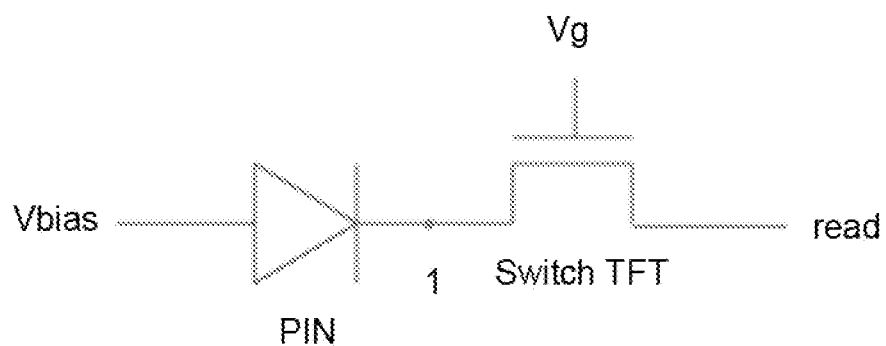
FIG. 8 is a circuit diagram of a fingerprint recognition circuit according to an embodiment of the present disclosure.

FIG. 8 is a circuit diagram of a fingerprint recognition circuit according to an embodiment of the present disclosure.

As shown in FIG. 8, the display panel may include a photosensitive circuit and an output circuit. The photosensitive circuit may include a photosensitive unit. Specifically, a variety of photoelectric sensors may be used. The output circuit may include a transistor. An output of the photosensitive unit may be connected to an input end of the output circuit.

In some embodiments, the photosensitive circuit includes a PIN photodiode, and the output circuit includes a thin film transistor (hereinafter referred to as a switch TFT) as a switch. An input end of the PIN photodiode receives a bias voltage (Vbias) signal, and after receiving reflected light from a fingerprint, an induced electrical signal is generated, and the induced electrical signal is transmitted to a source electrode of the switch TFT. A read circuit may read the above-mentioned induced electrical signal from a drain electrode of the switch TFT. It should be noted that a gate electrode of the switch TFT may receive a gate electrode signal (Vg).

Zero-bias mode and reverse-bias mode are two operating modes of a photodiode. For example, in a zero-bias mode, the photodiode has a less dark current. In a reverse-bias mode, a linear output may be achieved. A photoelectric conversion circuit provided by some embodiments of the present disclosure may switch the two operating modes of the photodiode, so as to facilitate a selection according to actual needs. For example, when the photoelectric conversion circuit achieves a detection function, the photodiode may be selected to operate in the reverse-bias mode to obtain linear output characteristics. When the photoelectric conversion circuit achieves a charging function, the photodiode may be selected to be in a zero-bias working mode to have a lower dark current. However, this is not limited in the embodiments of the present disclosure.

Specifically, in a pixel circuit of a sensor, each pixel consists of a PIN photodiode and a switch TFT. The PIN photodiode operates in a reverse-bias state. The PIN photodiode has a very little diode leakage current in a dark state. A reverse-bias current of the PIN photodiode increases in a light state, resulting in a large amount of photo-generated charges. The PIN photodiode and upper and lower electrodes form a capacitor to store the photo-generated charges. When the photo-generated charges are accumulated for a certain integration time, the switch TFT is turned on to read out the charges stored in the PIN photodiode. Due to a difference between light intensities of light reflected by the valley and the ridge of the fingerprint transmitted to the PIN photodiode, after a certain integration time, there is a difference in the quantity of photo-generated charges of PIN photodiodes corresponding to the valley and ridge positions, so as to recognize the fingerprint.

For example, a capacitance value of the first capacitor is in a range of 10 pF to 100 pF.

For example, in a case that a photosensitive element is implemented as a photodiode, a capacitance value of the first capacitor C1 is more than 100 times a capacitance value of a capacitor (reverse-bias capacitance) of the photodiode itself.

Referring to FIG. 8, when a pixel circuit of an in-cell fingerprint sensor is illuminated, the PIN photodiode not only acts as a generator of photo-generated charges, but also has its own capacitor for storing photo-generated charges. When working, the switch TFT is turned on first, and a potential at a position 1 is reset to a fixed value (for example, a preset value, such as 1.42V, etc.). After a certain integration time (e.g., 5 ms, 10 ms, 30 ms, 50 ms, 80 ms or 100 ms, etc.), the switch TFT is turned on, and the charges stored in the capacitor of the PIN photodiode are read out.

One of key difficulties of an in-cell fingerprint recognition technology is anti-strong light. This is mainly because an in-cell fingerprint recognition sensor is located between film layers of TFT and OLED light-emitting diodes, and has a very high transmittance, which is much higher than a light intensity received by a below-cell fingerprint recognition sensor. Light received by the sensor includes light reflected back from display light through a finger or a film layer and light reaching the sensor through the finger from the outside world, especially when a light intensity in an outdoor strong light environment is up to 10 W 1x, an light intensity reaching the sensor through the finger may reach dozens or hundreds of 1x. The high light intensity may result in a higher charge level in the PIN photodiode. According to the formula $\Delta Q = C \times \Delta U$, since a capacitance C is fixed, and a voltage $\Delta U$ has an upper limit, too high $\Delta U$ may lead to an increase in dead points of a diode and a worsen stability. Therefore, there is an upper limit on a capacity of the PIN photodiode to store charges. The quantity of photo-generated charges generated by the PIN photodiode far exceeds the upper limit of the stored charges due to strong outdoor light, resulting in saturation of the quantity of charges. Therefore, a difference between signals of PIN photodiodes of pixels corresponding to the valley and the ridge of the finger may not be distinguished, resulting in a failure of the sensor.

Figure 9:
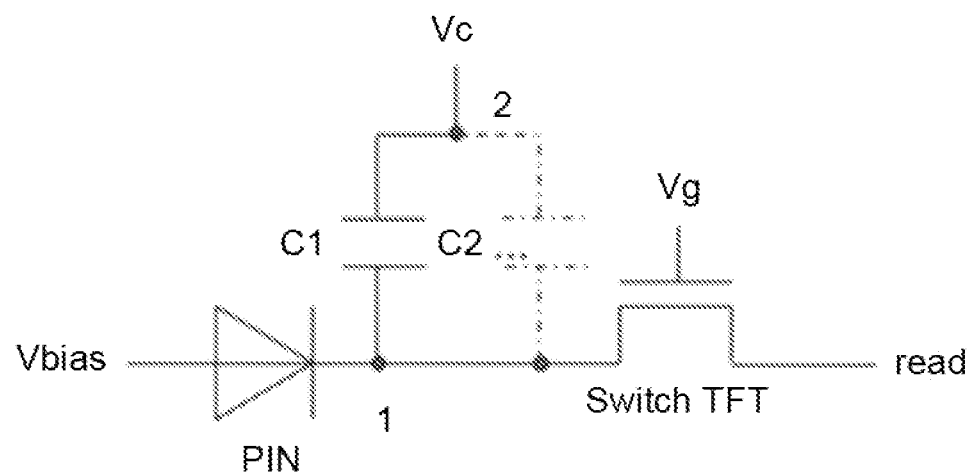
FIG. 9 is a circuit diagram of a fingerprint recognition circuit according to another embodiment of the present disclosure.

FIG. 9 is a circuit diagram of a fingerprint recognition circuit according to another embodiment of the present disclosure.

The embodiments of the present disclosure provide an OLED structure that improves an anti-strong light capability of an in-cell fingerprint recognition sensor. As shown in FIG. 9, by adding one or more new capacitors outside an output end of the PIN photodiode, one side of the capacitor is connected to a negative electrode of the PIN photodiode, and the other side may be connected to a normal voltage signal or Vbias voltage, etc., which may improve a storage capacity of the PIN photodiode for high charges in a strong light environment. A problem of saturation of the PIN photodiode of the in-cell fingerprint recognition sensor of the OLED display screen under strong outdoor light may be effectively improved by improving the storage capacity for charges. In addition, an increase of the upper limit of the stored charge quantity may also further increase an upper limit of a signal volume, which is beneficial to an improvement of a signal-to-noise ratio.

Referring to FIG. 9, one or more new capacitors (C1, C2, etc.) are added outside the output end of the PIN photodiode, which play a role of charge storage. To add a new capacitor C1 is described as an example. A position 1 of one electrode of the new capacitor C1 is connected to the negative electrode of the PIN photodiode, and a position 2 of the other electrode of the new capacitor C1 may be connected to a constant voltage signal. The constant voltage signal may be any one of VGL, a single constant voltage signal, or a Vbias signal. A choice of a voltage difference may be determined according to the quantity of charges that needs to be stored. Specifically, the determination may be made according to the formula $\Delta Q = C \times \Delta U$: when $\Delta U$ of the new capacitor C1 increases, the quantity $\Delta Q$ of charges that may be stored may be increased, and the capacitor C1 and the PIN photodiode store charges together. Since in a strong light environment, a sensitive light response of the PIN photodiode makes it generate more photo-generated charges, a voltage difference between the position 1 of the electrode and the position 2 of the electrode of the newly added capacitor C1 may increase a total storage capacity for the quantity of charges. When working, the switch TFT is turned on first, and a potential at the position 1 of the electrode is reset to a fixed value (such as 1.42V or other potentials). After a certain integration time (such as 5 ms, 10 ms, 30 ms, 50 ms, 80 ms or 100 ms, etc.), the switch TFT is turned on, and all the charges stored in the PIN and the new capacitor are read out.

For example, in a photosensitive stage, the switch TFT is turned off so that the photodiode receives a light signal, and converts the light signal into an electrical signal to be stored in the newly added capacitor.

For example, when the photoelectric conversion circuit does not perform a light detection to achieve related functions, the photosensitive element may be used to sense ambient light for a long time and convert the ambient light into an electrical signal, and a storage circuit has a large storage capacity to store photoelectric charges generated by a photoelectric induction, which may ensure an effective storage and accumulation of the electrical signal, and reduce a risk of over-saturation of a charge storage capacity of a fingerprint detection circuit under strong light.

In a read phase, the transistor is turned on, and the photodiode is in a reverse-bias state. The stored electrical signal is output through the switch TFT to be read.

In order to improve an anti-strong light saturation capability of the PIN photodiode of the in-cell fingerprint recognition sensor of the OLED, the embodiments of the present disclosure may improve a charge storage capability of the PIN photodiode by increasing a capacitor, which may effectively improve a problem of saturation of an in-cell fingerprint recognition under strong light. In addition, an increase of the upper limit of the stored charge quantity may further increase an upper limit of a signal volume, which promotes an improvement of a SNR signal-to-noise ratio (SNR=signal volume/noise) of the fingerprint recognition sensor.

An implementation structure of the newly added capacitor may adopt various structures. Manufacturing processes corresponding to the various structures may also adopt various processes.

In some embodiments, the display panel may include: a base substrate, a pixel circuit, and a fingerprint recognition circuit.

The pixel circuit is arranged on the base substrate, the pixel circuit includes a transistor, and the transistor includes an active layer, a gate electrode, a first electrode and a second electrode. For example, the first electrode may be a source electrode and the second electrode may be a drain electrode. For example, the first electrode may also be a drain electrode, and the second electrode may be a source electrode, which is not limited in the present disclosure.

The fingerprint recognition circuit includes a photosensitive circuit, a storage circuit and an output circuit, the storage circuit includes a first capacitor, and the first capacitor includes a first capacitance electrode and a second capacitance electrode; a transistor of the output circuit is arranged in the same layer as a transistor of the pixel circuit.

The photosensitive circuit is configured to convert a received optical signal into an electrical signal, the storage circuit is configured to store the electrical signal, the output circuit includes a control switch is configured to control the photosensitive circuit to charge the storage circuit in an off state and output at least the stored electrical signal is output in the closed state, so as to perform a fingerprint recognition based on the outputted electrical signal.

The first capacitance electrode is arranged in the same layer as at least one of the gate electrode, the active layer, the first electrode or the second electrode, and/or the second capacitance electrode is arranged in the same layer as at least one of the gate electrode, the active layer, the first electrode or the second electrode; the first capacitance electrode is located in la layer different from a layer where the second capacitance electrode is located, and an orthographic projection of the first capacitance electrode on the base substrate at least partially overlaps with an orthographic projection of the second capacitance electrode on the base substrate.

The above "same layer" refers to a layer structure formed by using the same film forming process to form a film layer for forming specific patterns, and then using the same mask through one patterning process. Depending on the specific patterns, the same patterning process may include multi-exposure, development or etching processes. The specific patterns in the formed layer structure may be continuous or discontinuous, and these specific patterns may also be at different heights or have different thicknesses.

In order to achieve the structure of the above-mentioned newly added capacitor, an existing metal layer in the OLED display panel may be reused as an electrode of the newly added capacitor. In addition, a new metal layer may also be added as a partial electrode of the newly added capacitor.

In some embodiments, if a design space allows, a gate electrode (the gate electrode may include a first gate line (gate1, g1 for short) and a second gate line (gate2, g2 for short)), a heavily-doped polysilicon (poly Si), a source/drain electrode (a double-layer source/drain electrode may include a first source/drain electrode (Source/Drain 1, SD1 for short), and a second source/drain (Source/Drain 2, SD2 for short) and other film layers in the OLED display panel structure may be reused as two electrodes of the newly added capacitor. In addition, a gate insulating layer (GI for short) may also be used as an insulating layer between the two electrodes of the newly added capacitor. There is no newly added process and no increased cost in the above-mentioned structure.

It should be noted that the OLED display panel may have structures such as a single-layer gate electrode, a double-layer gate electrode, a single-layer source/drain electrode or double-layer source/drain electrode, one or more layers of which may be reused as at least one electrode of a newly added capacitor or at least one electrode of a plurality of newly added capacitors.

For example, a first electrode of the newly added capacitor may be formed in a layer where the first gate line g1 is located, and a second electrode of the newly added capacitor may be formed in a layer where the second gate line g2 is located.

For example, a first electrode of the newly added capacitor may be formed in a layer where the first gate line g1 is located, and a second electrode of the newly added capacitor may be formed in a layer where the first source/drain electrode SD1 is located.

For example, a first electrode of the newly added capacitor may be formed in a layer where the first gate line g1 is located, and a second electrode of the newly added capacitor may be formed in a layer where the second source/drain electrode SD2 is located.

For example, a first electrode of the newly added capacitor may be formed in a layer where the second gate line g2 is located, and a second electrode of the newly added capacitor may be formed in a layer where the first source/drain electrode SD1 is located.

For example, a first electrode of the newly added capacitor may be formed in a layer where the second gate line g2 is located, and a second electrode of the newly added capacitor may be formed in a layer where the second source/drain electrode SD2 is located.

For example, a first electrode of the newly added capacitor may be formed in a layer where the first gate line g1 is located, and a second electrode of the newly added capacitor may be formed in a layer where the heavily-doped polysilicon (poly Si) is located.

For example, a first electrode of the newly added capacitor may be formed in a layer where the second gate line g2 is located, and a second electrode of the newly added capacitor may be formed in a layer where the heavily-doped polysilicon (poly Si) is located.

The insulating layer between the two electrodes of the newly added capacitor may reuse one or more layers formed of insulating materials existing in the OLED display panel.

In some embodiments, the above-mentioned display panel may further include one or more electrically insulating layers.

For example, an interlayer dielectric layer is arranged on a side of the gate electrode away from the base substrate.

For example, an insulating layer is provided, and a first thickness of the insulating layer may be greater than a second thickness of the interlayer dielectric layer. The insulating layer may include, but is not limited to, at least one of a cover layer, an interlayer dielectric layer, a protective layer or a planarization layer.

For example, a material of a gate dielectric layer includes, but is not limited to, at least one of silicon dioxide, silicon oxynitride, silicon nitride, hafnium oxide, etc.

For example, the gate electrode is arranged on the gate dielectric layer. The gate electrode may be composed of a conductive material. For example, the gate electrode may be a metal material such as a tungsten material, an aluminum material, or a copper material, etc.

For example, the interlayer dielectric layer is arranged around peripheral sides of the active layer, the gate dielectric layer and the gate electrode. A material of an interlayer insulating layer includes, but is not limited to, silicon dioxide, silicon oxynitride, an organic transparent material, etc.

For example, the first electrode includes: a first sub-electrode and a second sub-electrode.

The first sub-electrode is arranged on a side of the interlayer dielectric layer away from the base substrate. The second sub-electrode is arranged on a side of the first sub-electrode away from the base substrate, and the insulating layer is arranged between the first sub-electrode and the second sub-electrode.

For example, the photosensitive circuit is arranged on a side of the second sub-electrode away from the base substrate.

FIG. 10 is a schematic structural diagram of a display panel according to an embodiment of the present disclosure.

As shown in FIG. 10, the gate electrode includes a first gate line g1 and a second gate line g2, and the first gate line g1 is located in a layer different from a layer where the second gate line g2 is located.

A first capacitance electrode 25 is arranged in the same layer as the first gate line g1 or the second gate line g2, and a second capacitance electrode 27 is arranged in the same layer as the first gate line g1 or the second gate line g2.

In addition, the above-mentioned display panel may further include a plurality of the following electrical insulating layers, and an electrical connection between electrodes of different layers is achieved by providing a via hole in the electrical insulating layers.

For example, a first gate dielectric layer 24 is arranged between an active layer 22 and the first gate line g1.

For example, a second gate dielectric layer 26 is arranged between the first gate line g1 and the second gate line g2.

For example, an interlayer dielectric layer 28 is arranged on a side of the second gate dielectric layer g2 away from a base substrate 20.

In FIG. 10, the first capacitance electrode 25 is connected to the first electrode through a first via hole K1. The first via hole K1 is arranged in the second gate dielectric layer 26 and the interlayer dielectric layer 28, and the first via hole K1 exposes the first capacitance electrode 25.

In addition, if the second capacitance electrode 27 is used as an output end of the newly added capacitor, the second capacitance electrode 27 may be connected to the first electrode 29 through a second via hole. The second via hole is arranged in the interlayer dielectric layer 28, and the second via hole exposes the second capacitance electrode 27.

In some embodiments, the above-mentioned display panel may further include: a transparent conductive layer arranged on a side of the PIN photodiode away from the base substrate. The transparent conductive layer is connected to a lead-in electrode 45 of a bias voltage signal (Vbias signal). This helps to reduce a contact resistance between the PIN photodiode and the lead-in electrode 45, thereby reducing an overall resistance of the circuit. In addition, the use of a transparent conductive electrode may reduce an absorption and/or reflection of light by the electrode. For example, a material of the transparent conductive layer includes, but is not limited to, at least one of indium tin oxide (ITO), indium zinc tin oxide (ITZO), etc.

Referring to FIG. 10, the display panel may include: a base substrate 20, a buffer layer 21, an active layer 22, a first gate dielectric layer 24, a first electrode 25, a first gate line g1, and a first gate dielectric layer 26, a second gate line g2, a second electrode 27, an interlayer dielectric layer (ILD) 28, a first source/drain electrode SD1, a first source/drain electrode 29 of a transistor of an output circuit, a first protective layer (PVX1) 30, a first planarization layer (such as PLN1) 31, a first protective layer (PVX2) 32, a second source/drain electrode SD2, a second source/drain electrode 33 of the transistor of the output circuit, an N pole 34 of a PIN photodiode, an I pole 35 of the PIN photodiode, a P pole 36 of the PIN photodiode, an ohmic contact layer (such as ITO) 37, a cover layer 38, a second planarization layer (such as PLN2) 39, an anode 40, an organic light-emitting layer (EL) 41, a microstructure layer (such as a microsphere layer PS) 43, a cathode 42 and a thin film encapsulation layer (TFE for short) 44.

The lead-in electrode 45 in contact with the ohmic contact layer (such as ITO) 37 may be configured to lead in a Vbias electrical signal as shown in FIG. 9. The transistor of the output circuit may be implemented as a thin film transistor, the active layer of which is, for example, amorphous silicon, polysilicon or metal oxide semiconductors (such as indium gallium zinc oxide (IGZO), aluminum doped zinc oxide (AZO), indium zinc oxide (IZO), etc).

It should be noted that the structure of the OLED display panel described above is only for the convenience of understanding the technical solutions of the present disclosure, and should not be construed as limiting the technical solutions of the embodiments of the present disclosure. For example, the first protective layer (PVX1) 30, the first planarization layer (such as PLN1) 31, and the first protective layer (PVX2) may use fewer layers or more layers. For example, the gate electrode may use a single-layer gate electrode and a single-layer gate dielectric layer, or the gate electrode may use three or more layers of gate electrodes and three or more layers of gate dielectric layers, etc. For example, the source/drain electrode may use a single-layer source/drain electrode, or the source/drain electrode may use three layers of source/drain electrodes or more layers of source/drain electrodes, etc., which are not limited in the present disclosure.

Figure 11:
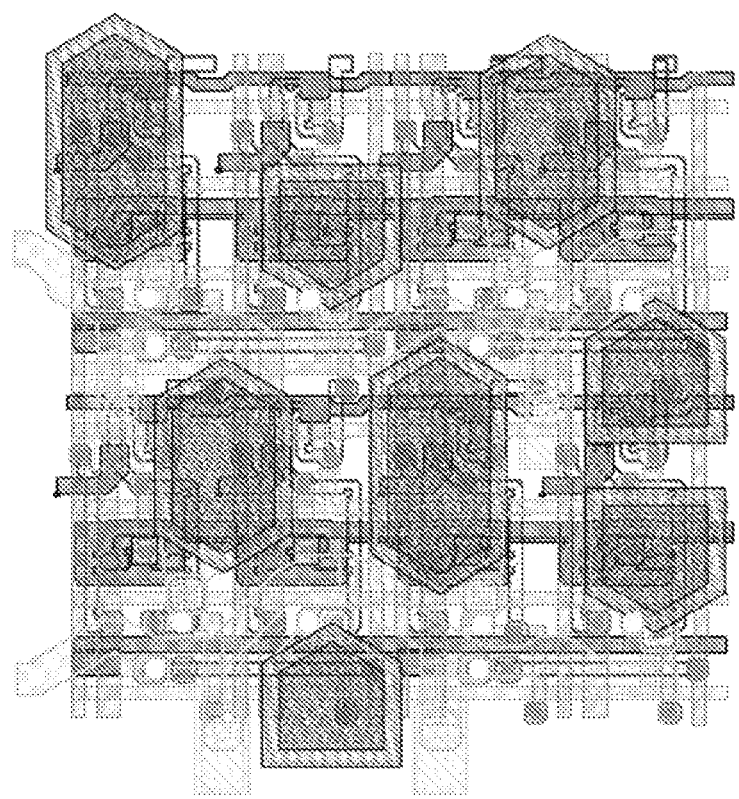
FIG. 11 is a plan design view of all film layers with a gate1 and a gate2 as two electrodes of a capacitor for FIG. 10 according to an embodiment of the present disclosure.

FIG. 11 is a plan design view of all film layers with a gate1 and a gate2 as two electrodes of a capacitor for FIG. 10 according to an embodiment of the present disclosure.

FIG. 11 is a plan design view of all film layers of an OLED display panel, and the OLED display panel includes a fingerprint recognition circuit having a newly added capacitor. A diamond pattern and a pentagon pattern in the uppermost layer in FIG. 11 correspond to a plurality of anodes of the OLED display panel, an anode serves as an anode of an organic light-emitting diode, and each anode corresponds to a sub-pixel. Each sub-pixel is used to emit light of one color, such as red, blue, or green. It should be noted that positions of each sub-pixel may be set in various arrangements.

For example, when an arrangement of the sub-pixels P in the display panel 1' in FIG. 2 adopts a standard RGB mode, each pixel includes three sub-pixels P, and emission colors of the three sub-pixels P are three primary colors, such as red, green and blue in sequence. An arrangement of RGB mode is the most standard arrangement, in which a square-shaped pixel is divided into three equal parts, and each block is given a different color, which facilitates a fabrication of the sub-pixels P.

For another example, when the arrangement of the sub-pixels P in the display panel 1' adopts a RGB Pentile (RGB arrangement) mode, each pixel unit includes 4 sub-pixels P, and emission colors of the four sub-pixels P are, for example, red, green, blue, and green in sequence, and an area of the sub-pixels whose emission colors are red and blue is larger than that of the sub-pixels P whose emission color is green.

The Pentile arrangement mainly reduces the number of sub-pixels P in a manner of sharing the sub-pixels P by adjacent pixels, so as to achieve an effect of simulating a high resolution with a low resolution. The biggest advantage of the Pentile arrangement is to increase a permeability, and the same brightness requires a less power consumption, so that a battery life of the display panel 1' may be improved, and a cost of the display panel 1' may be significantly reduced.

In the same row of sub-pixels P, emission colors of the sub-pixels P in each pixel unit have the same arrangement order. For example, the first one of four sub-pixels P included in each pixel unit located in the first row is a sub-pixel P whose emission color is red. The second is a sub-pixel P whose emission color is green. The third is a sub-pixel P whose emission color is blue. The fourth is also a sub-pixel P whose emission color is green. That is, in the pixel unit, the arrangement order of the emission colors of each sub-pixel P is red, green, blue and green. Emission colors of sub-pixels P in pixel units located in different rows are not the same. For example, in sub-pixels P in the second row, an arrangement order of emission colors of the sub-pixels P in each pixel unit is blue, green, red and green.

Each pixel unit includes three sub-pixels P, the first of which is a sub-pixel P whose emission color is red. The second is a sub-pixel P whose emission color is green. The third is a sub-pixel P whose emission color is blue. The emission colors of the sub-pixels P in the pixel units located in different rows have the same arrangement order, that is, red, green and blue. In the structure, a pixel unit is a pixel.

When a plurality of sub-pixels P are divided into a plurality of pixel units, a gate electrode drive circuit 13 may be arranged between two adjacent pixel units. For example, at least one first thin film transistor group 131 is located between two adjacent pixel units.

When the plurality of sub-pixels P are divided into the plurality of pixel units, and the first thin film transistor group 131 is arranged between two adjacent pixels P, since there is a small distance between two adjacent sub-pixels P in each pixel unit. On the one hand, when a pixel unit may be used as a pixel, adjacent pixels may be displayed relatively independently, which is beneficial to ensure a display effect of the display panel 1'. On the other hand, since the number of pixel units is less than the number of sub-pixels P, the first thin film transistor group 131 is arranged by using an empty area between two adjacent pixel units, which is beneficial to improve a pixel density (PPI) of the display panel 1'.

Figure 12:
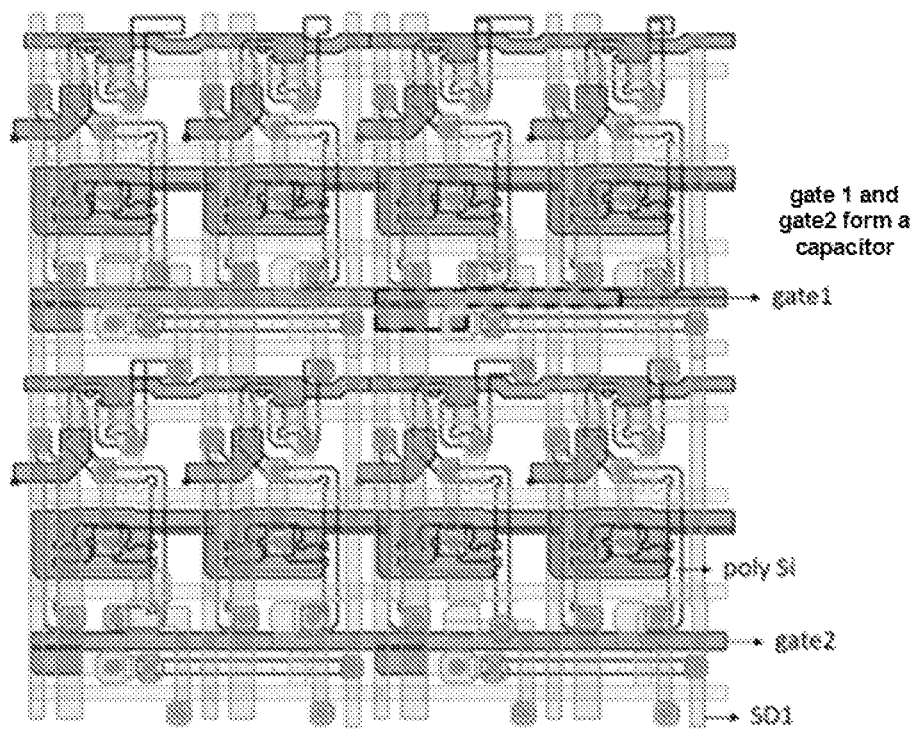
FIG. 12 is a plan design view of a poly Si, a gate1, a gate2, an SD, and an ILD layer with a gate1 and a gate2 as two electrodes of a capacitor for FIG. 10 according to an embodiment of the present disclosure.

FIG. 12 is a plan design view of a poly Si, a gate1, a gate2, an SD, and an ILD layer with a gate1 and a gate2 as two electrodes of a capacitor for FIG. 10 according to an embodiment of the present disclosure.

Referring to FIG. 12, only a poly Si, a gate1, a gate2, an SD, and an ILD layer are shown for the convenience of viewing a layout of a newly added capacitor. A shape of the first electrode 25 in a layer where the first gate line gate1 is located is a dotted frame donated by a gate1 in FIG. 12. A shape of the second electrode 27 in a layer where the second gate line gate2 is located is a shape donated by a gate2 in FIG. 12. However, an orthographic projection of the second electrode 27 on the base substrate 20 and an orthographic projection of the first electrode 25 on the base substrate 20 at least partially overlap.

In some embodiments, the gate electrode includes a first gate line and a second gate line, and the first gate line is located in a layer different from a layer where the second gate line is located.

Correspondingly, the first capacitance electrode is arranged in the same layer as the first gate line or the second gate line, and the second capacitance electrode is arranged in the same layer as the active layer.

Figure 13:
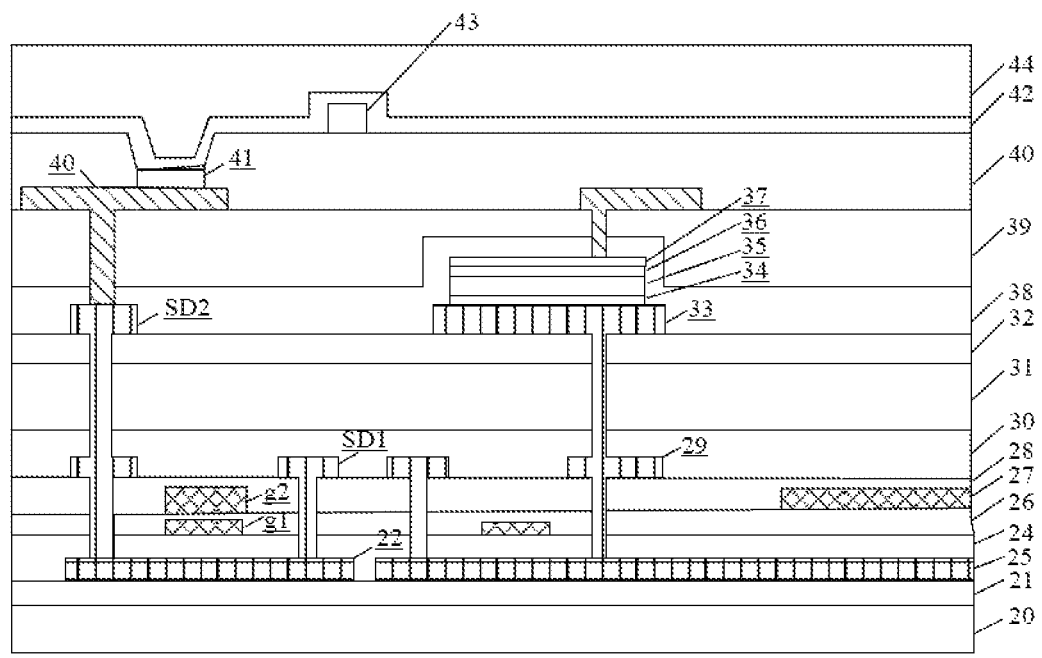
FIG. 13 is a schematic structural diagram of a display panel according to an embodiment of the present disclosure.

FIG. 13 is a schematic structural diagram of a display panel according to an embodiment of the present disclosure.

As shown in FIG. 13, different from FIG. 10, a first electrode 25 is not located in a layer where a first gate line g1 is located in an OLED display panel, and the first electrode 25 is located in a layer where an active layer is located. An electrode located in the layer where the active layer is located is used as the first electrode 25 of the newly added capacitor, and a second electrode 27 is located in a layer where a second gate line g2 is located.

In addition, the first electrode 25 may also be located in the layer where the active layer is located, and the second electrode 27 may be located in the layer where the first gate line g1 is located, which will not be described in detail here.

The display panel in FIG. 13 may include: a base substrate 20, a buffer layer 21, an active layer 22, a first gate dielectric layer 24, a first electrode 25, a first gate line g1, and a first gate dielectric layer 26, a second gate line g2, a second electrode 27, an interlayer dielectric layer (ILD) 28, a first source/drain electrode SD1, the first source/drain electrode 29 of a transistor of an output circuit, a first protective layer (PVX1) 30, a first planarization layer (such as PLN1) 31, a first protective layer (PVX2) 32, a second source/drain electrode SD2, a second source/drain electrode 33 of the transistor of the output circuit, an N pole 34 of a PIN photodiode, an I pole 35 of the PIN photodiode, a P pole 36 of the PIN photodiode, an ohmic contact layer (such as ITO, for reducing a contact resistance) 37, a cover layer 38, a second planarization layer (such as PLN2) 39, an anode 40, an organic light-emitting layer (EL) 41, a microstructure layer (such as PS) 43, a cathode 42 and a thin film encapsulation layer (TFE) 44.

Figure 14:
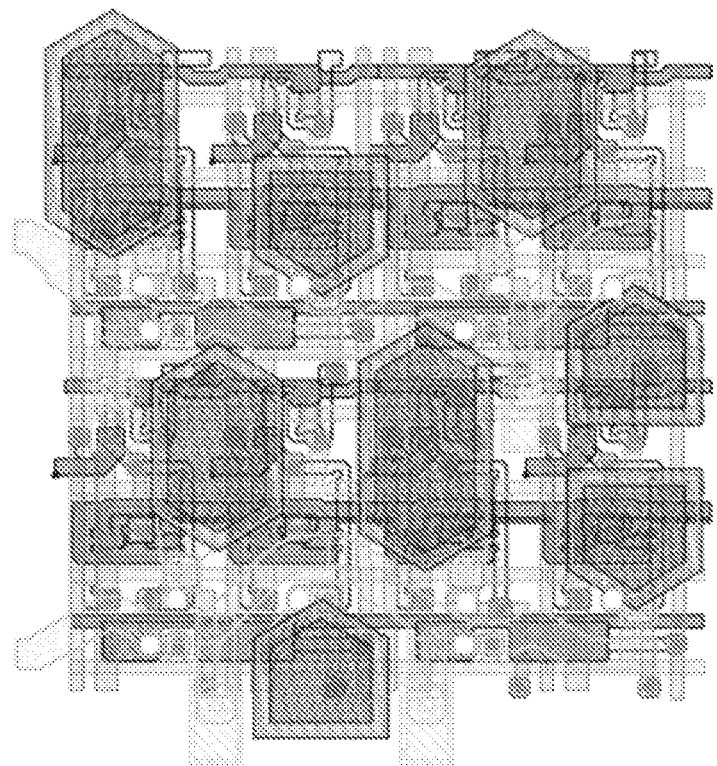
FIG. 14 is a plan design view of all film layers with a poly Si and a gate2 as two electrodes of a capacitor for FIG. 13 according to an embodiment of the present disclosure.

FIG. 14 is a plan design view of all film layers with a poly Si and a gate2 as two electrodes of a capacitor for FIG. 13 according to an embodiment of the present disclosure.

As shown in FIG. 14, the content related to FIG. 11 may be referred to. A difference is that a first electrode is further located in the layer where the active layer is located, and other layouts may be the same, which will not be repeated here.

Figure 15:
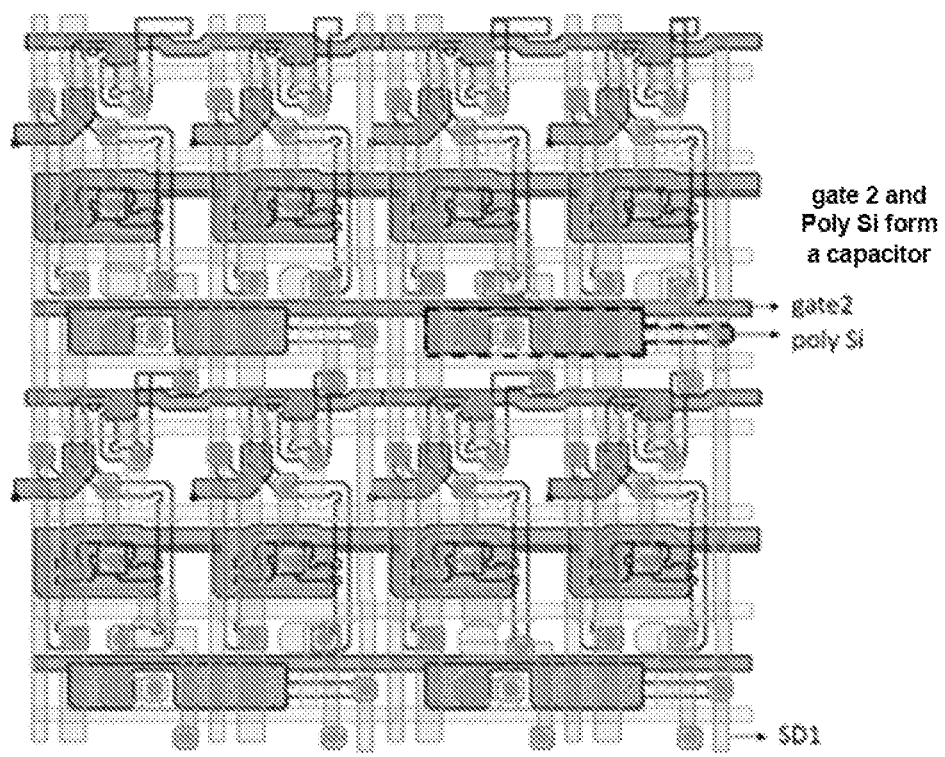
FIG. 15 is a plan design view of a poly Si, a gate1, a gate2, an SD, and an ILD layer with a poly Si and a gate2 as two electrodes of a capacitor for FIG. 13 according to an embodiment of the present disclosure.

FIG. 15 is a plan design view of a poly Si, a gate1, a gate2, an SD, and an ILD layers with a poly Si and a gate2 as two electrodes of a capacitor for FIG. 13 according to an embodiment of the present disclosure.

As shown in FIG. 15, a dashed dumbbell-shaped frame denoted by a poly Si is a first electrode formed in a layer where the active layer is located. An orthographic projection of the first electrode on the base substrate overlaps with an orthographic projection of a second electrode (arranged in a layer where the second gate line gate2 is located), so as to form the above-mentioned newly added capacitors C1, C2, etc.

In some embodiments, the first electrode or the second electrode may be arranged in a newly added metal layer.

For example, when a design space is insufficient, a metal layer and an insulating layer may be newly added. A cover layer is not masked separately, but together with the newly added insulating layer. Therefore, only one mask needs to be added, and a bottom electrode of a PIN photodiode and the newly added metal layer are used as two electrodes of the newly added capacitor.

In some embodiments, the first capacitance electrode is arranged in the same layer as at least one of the gate electrode, the active layer or the first electrode, and the second capacitance electrode is arranged on a first metal layer. The first metal layer is located on a layer different from a layer where the gate electrode, the active layer and the first electrode are respectively located. Alternatively, the second capacitance electrode is arranged in the same layer as at least one of the gate electrode, the active layer or the first electrode, and the first capacitance electrode is arranged on a second metal layer. The second metal layer is located on a layer different from a layer where the gate electrode, the active layer and the first electrode are respectively located.

Figure 16:
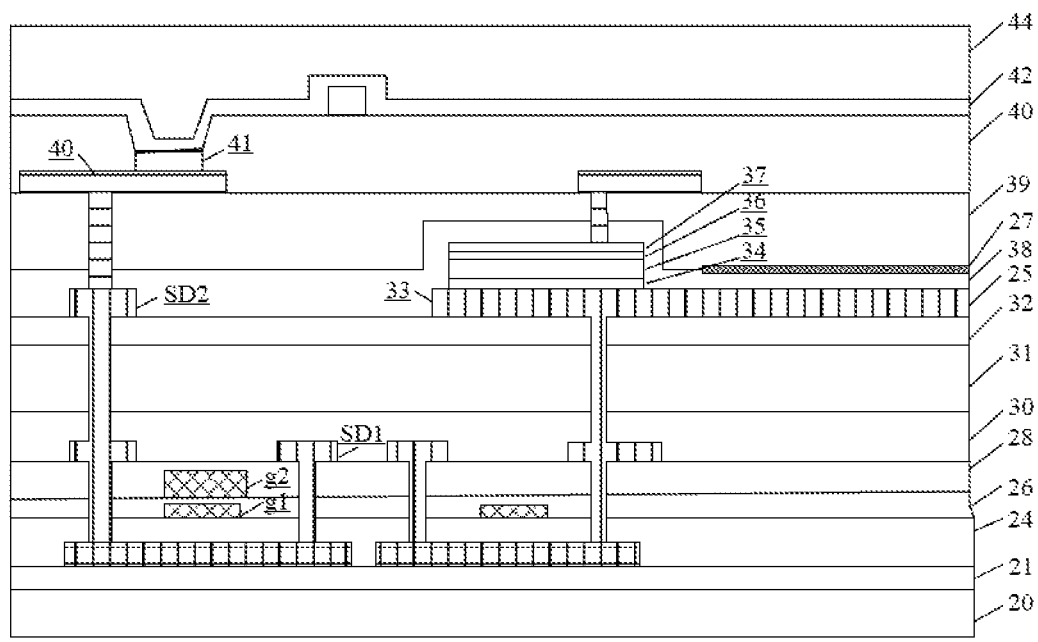
FIG. 16 is a schematic structural diagram of a display panel according to an embodiment of the present disclosure.

FIG. 16 is a schematic structural diagram of a display panel according to an embodiment of the present disclosure.

As shown in FIG. 16, different from FIG. 10, a first electrode 25 is not arranged in a layer where a first gate line g1 is located in an OLED display panel, and a second electrode 27 is not arranged in a layer where a second gate line g2 is located. In FIG. 16, the first electrode 25 is arranged in a layer where a second source/drain electrode 33 is located. The second electrode 27 is arranged in a newly added metal layer. The first electrode 25 is arranged at a position corresponding to the second electrode 27 in the layer where the second source/drain electrodes 33 are located.

In addition, the first electrode 25 or the second electrode 27 may also be arranged in a layer where a first source/drain electrode SD1 is located. The first electrode 25 or the second electrode 27 may also be arranged in the layer where the first gate line g1 is located. The first electrode 25 or the second electrode 27 may also be arranged in the layer where the second gate line g2 is located. The first electrode 25 or the second electrode 27 may also be arranged in a layer where an active layer (heavily-doped Poly-Si) is located, which will not be described in detail here.

The display panel in FIG. 16 may include: a base substrate 20, a buffer layer 21, an active layer 22, a first gate dielectric layer 24, a first gate line g1, a first gate dielectric layer 26, a second gate line g2, an interlayer dielectric layer (ILD) 28, a first source/drain electrode SD1, a first source/drain electrode 29 of a transistor of an output circuit, a first protective layer (PVX1) 30, a first planarization layer (such as PLN1) 31, a first protective layer (PVX2) 32, a second source/drain electrode SD2, a second source/drain 33 of the transistor of the output circuit, a first electrode 25, an N pole 34 of a PIN photodiode, an I pole 35 of the PIN photodiode, a P electrode 36 of the PIN photodiode, an ohmic contact layer (such as ITO, for reducing a contact resistance) 37, a cover layer 38, a second electrode 27, a second planarization layer (such as PLN2) 39, an anode 40, an organic light-emitting layer (EL) 41, a microstructure layer (such as PS) 43, a cathode 42 and a thin film encapsulation layer (TFE) 44.

It should be noted that a new insulating layer may also be provided for the first electrode 25, for example, a new insulating layer is provided between the first electrode 25 and the second electrode 27.

In some embodiments, the first capacitance electrode is arranged in the same layer as the first electrode, the second capacitance electrode is arranged on a side of the photosensitive circuit away from the base substrate, and a distance exists between the orthographic projection of the second capacitance electrode on the base substrate and an orthographic projection of the photosensitive circuit on the base substrate. Referring to FIG. 16, a certain gap exists between an orthographic projection of the second electrode 27 on the base substrate 20 and an orthographic projection of the PIN photodiode (including the N pole 34, the I pole 35 and the P pole 36) on the base substrate 20.

Figure 17:
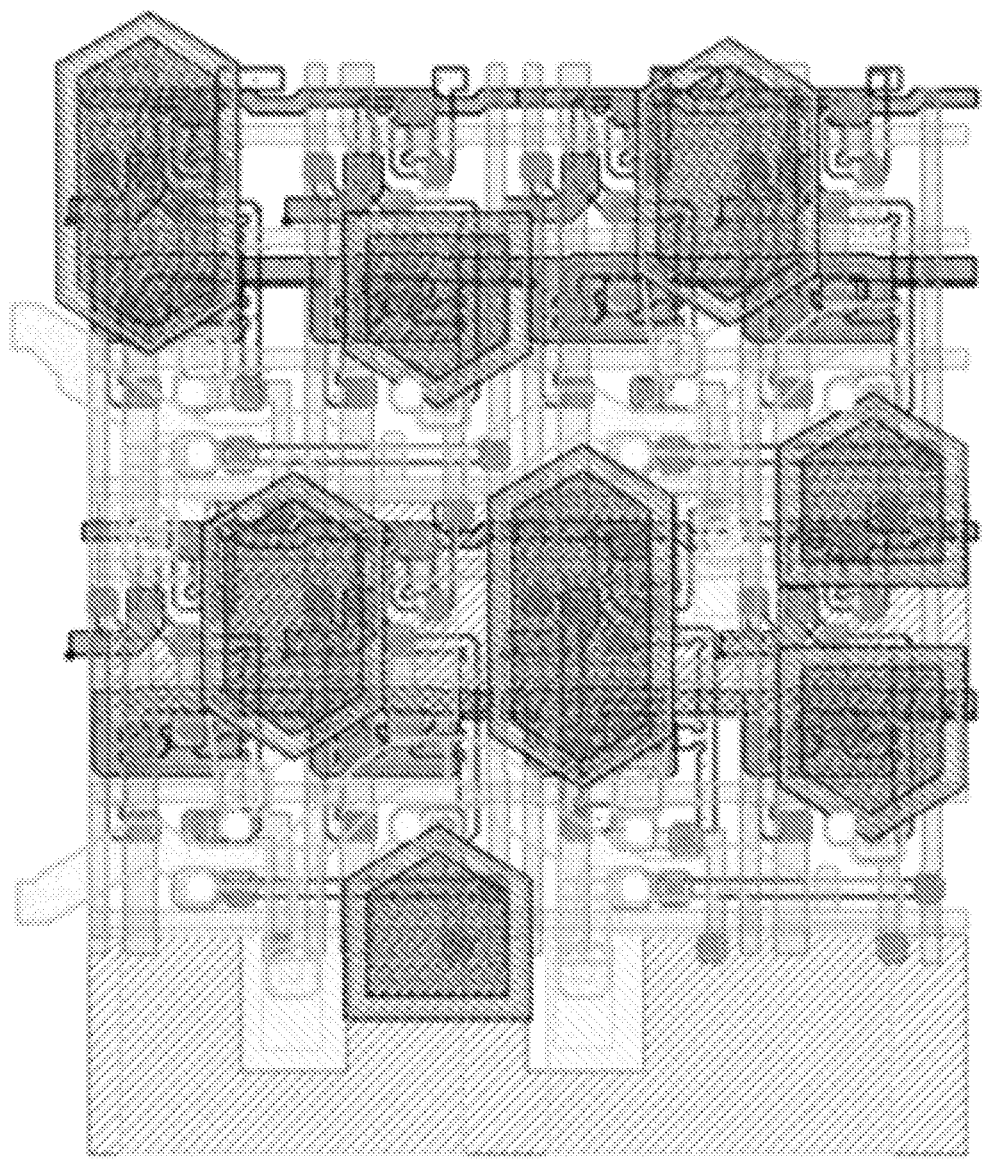
FIG. 17 is a plan design diagram of all film layers with an SD2 and a newly added metal as two electrodes of a capacitor for FIG. 16 according to an embodiment of the present disclosure.

FIG. 17 is a plan design diagram of all film layers with an SD2 and a newly added metal as two electrodes of a capacitor for FIG. 16 according to an embodiment of the present disclosure.

As shown in FIG. 17, the content related to FIG. 11 may be referred to. A difference is that a metal layer is newly added, and a second electrode 27 is provided in the newly added metal layer. In addition, a first electrode 25 is also provided in a layer where a second source/drain electrode SD2 is located. Other layouts may be the same, which will not be repeated here.

Figure 18:
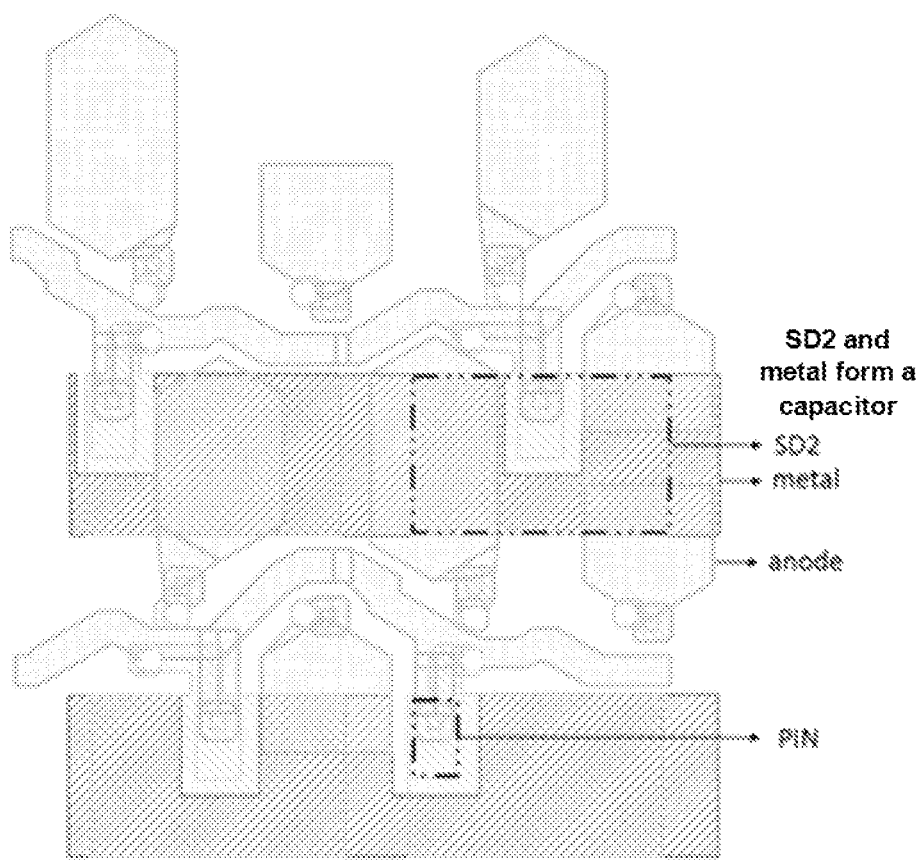
FIG. 18 is a plan design view of an SD2, a metal, and an anode layer with a poly Si and a gate2 as two electrodes of a capacitor for FIG. 16 according to an embodiment of the present disclosure.

FIG. 18 is a plan design view of an SD2, a metal, and an anode layer with a poly Si and a gate2 as two electrodes of a capacitor in FIG. 16 according to an embodiment of the present disclosure.

As shown in FIG. 18, a box with a groove denoted by a metal is a second electrode formed in a newly added metal layer. An orthographic projection of the second electrode on the base substrate and an orthographic projection of a first electrode (arranged in a layer where a second source and drain SD2 is located) on the base substrate overlap, so as to form the above-mentioned newly added capacitors C1, C2, etc.

Through the above-mentioned method, a problem of saturation of the PIN photodiode for an OLED in-cell fingerprint recognition under strong outdoor light may be effectively improved without making too many changes to a display panel with an in-cell fingerprint recognition and without increasing too much cost, which may effectively improve an anti-strong light performance and a signal-to-noise ratio.

The following is an exemplary description of a scenario in which at least two capacitors are added.

In some embodiments, referring to FIG. 9, the storage circuit further includes at least one second capacitor connected in parallel with the first capacitor, and each of the at least one second capacitor includes a third electrode and a fourth electrode.

In some embodiments, the third electrode is arranged in the same layer as at least one of the gate electrode, the active layer or the first electrode, and the fourth electrode is arranged in the same layer as at least one of the gate electrode, the active layer or the first electrode; the third electrode is located in a layer different from a layer where the fourth electrode is located, and an orthographic projection of the third electrode on the base substrate at least partially overlaps with an orthographic projection of the fourth electrode on the base substrate.

For example, the first electrode and the third electrode may be arranged in the same layer or on different layers. For example, the second electrode and the fourth electrode may be arranged in the same layer or on different layers. For example, the first electrode and the fourth electrode may be arranged in the same layer or on different layers. For example, the second electrode and the third electrode may be arranged in the same layer or on different layers.

In some embodiments, the third electrode is arranged in the same layer as at least one of the gate electrode, the active layer or the first electrode, and the fourth electrode is arranged on the third metal layer, and the third metal layer is located in a layer different from a layer where the gate electrode, the active layer and the first electrode are respective located.

For example, referring to FIG. 10 and FIG. 13, the first electrode may be provided in a layer where the first gate line g1 is located, the second electrode may be provided in a layer where the second gate line g2 is located, the third electrode may be provided in the layer where the second gate line g2 is located, and the fourth electrode is provided in a layer where the active layer is located.

For example, the first electrode may be arranged in a layer where the first gate line g1 is located. For example, the second electrode may be arranged in a layer where the second gate line g2 is located. For example, the third electrode may be arranged in a layer where the first source/drain electrode SD1 is located. For example, the fourth electrode is arranged in a layer where the second source/drain electrode SD2 is located.

In some embodiments, the fourth electrode is arranged in the same layer as at least one of the gate electrode, the active layer or the first electrode, and the fourth electrode is arranged on a fourth metal layer, the fourth metal layer is located in a layer different from a layer where the gate electrode, the active layer and the first electrode are respectively located.

In some embodiments, the gate electrode includes a first gate line and a second gate line, and the first gate line is located in layer different form a layer where the second gate line is located. The third electrode is arranged in the same layer as the first gate line or the second gate line, the fourth electrode is arranged in the same layer as the first gate line or the second gate line, and the third electrode is located in layer different form a layer where the fourth electrode is located.

For example, referring to FIG. 10 and FIG. 16, the first electrode may be provided in a layer where the first gate line g1 is located, the second electrode may be provided in a layer where the second gate line g2 is located, the third electrode may be provided in a layer where the second source/drain electrode 33 is located, and the fourth electrode may be provided on a newly added metal layer (a layer where the reference numeral 27 in FIG. 16 is located, or on other layers).

For example, referring to FIG. 10 and FIG. 16, the first electrode may be provided in a layer where the first gate line g1 is located, the second electrode may be provided in a layer where the second gate line g2 is located, the third electrode may be provided in a layer where the second source/drain electrode 33 is located, and the fourth electrode may be provided in a newly added metal layer (a layer where the reference numeral 27 in FIG. 16 is located, or in other layers).

For example, the first electrode may be provided in a layer where the second gate line g2 is located, the second electrode may be provided in a layer where the active layer is located, the third electrode may be provided in a layer where the second source/drain electrode 33 is located, the fourth electrode may be provided on a newly added metal layer (a layer where the reference numeral 27 is located in FIG. 16, or in other layers).

In some embodiments, a PIN photodiode may occupy a position of a sub-pixel in a pixel unit of an OLED display panel, which may facilitate a formation of a half-screen fingerprint recognition (a fingerprint recognition region occupies approximately half of an entire screen) or a full-screen fingerprint recognition (a fingerprint recognition region occupies approximately the entire screen).

Specifically, the display panel may include: a plurality of pixel units. The plurality of pixel units are arranged on the base substrate, and the plurality of pixel units are arranged on the base substrate in an array. An orthographic projection of the pixel units on the base substrate and an orthographic projection of the photosensitive circuit on the base substrate overlap.

Referring to FIG. 10, the pixel units include at least one sub-pixel, each sub-pixel includes a light-emitting element, and the light-emitting element includes an anode.

The pixel circuit includes a sub-pixel drive circuit, and a first electrode of a transistor of the sub-pixel drive circuit is connected to the anode. For example, a drain electrode of the transistor of the sub-pixel drive circuit is connected to the anode, which facilitates applying a voltage to an organic light-emitting diode. The drain electrode and the anode of the transistor of the sub-pixel drive circuit may be connected through a via hole.

For example, a pixel unit may include four sub-pixels: a red sub-pixel, a blue sub-pixel, a green sub-pixel, and a fingerprint detection sub-pixel.

Referring to FIG. 1 and FIG. 10, a pixel unit located in a fingerprint recognition region may include three RGB sub-pixels, and the three sub-pixels respectively include light-emitting elements for emitting red light, green light and blue light. In addition, a sub-pixel is also provided in the pixel unit, which is used to provide a PIN photodiode, a switch TFT, a newly added capacitor, etc. The embodiments of the present disclosure do not limit an arrangement of the PIN photodiode, the switch TFT, the newly added capacitor, and related components in a light-emitting sub-pixel.

In some embodiments, the output circuit includes a first transistor, and the sub-pixel drive circuit includes at least one second transistor.

For example, a first electrode of the first transistor is arranged in the same layer as a first electrode of the second transistor. For example, a second electrode of the first transistor is arranged in the same layer as a second electrode of the second transistor.

For example, a gate electrode of the first transistor is arranged in the same layer as a gate electrode of the second transistor.

For example, an active layer of the first transistor is arranged in the same layer as an active layer of the second transistor.

In some embodiments, in order to further improve a signal-to-noise ratio of an output signal of a fingerprint recognition circuit, the output circuit may further include an operational amplifier (AMP). For example, the operational amplifier includes an input end and an output end, the input end is connected to an output end of the newly added capacitor so as to receive a photoelectric signal, and the output end outputs an amplified photoelectric signal.

The embodiments of the present disclosure provide a pixel circuit structure of an OLED in-cell fingerprint recognition sensor that may improve an anti-strong light capability and a signal-to-noise ratio by adding one or more capacitors to the PIN photodiode.

The embodiments of the present disclosure provide a process structure of the OLED in-cell fingerprint recognition sensor that may improve an anti-strong light capability and a signal-to-noise ratio by adding one or more capacitors to the PIN photodiode.

The embodiments of the present disclosure further provide a process structure that may reuse a heavily-doped poly Si as a side electrode of the newly added capacitor.

Another aspect of the present disclosure further provides a method for manufacturing a display panel.

Figure 19:
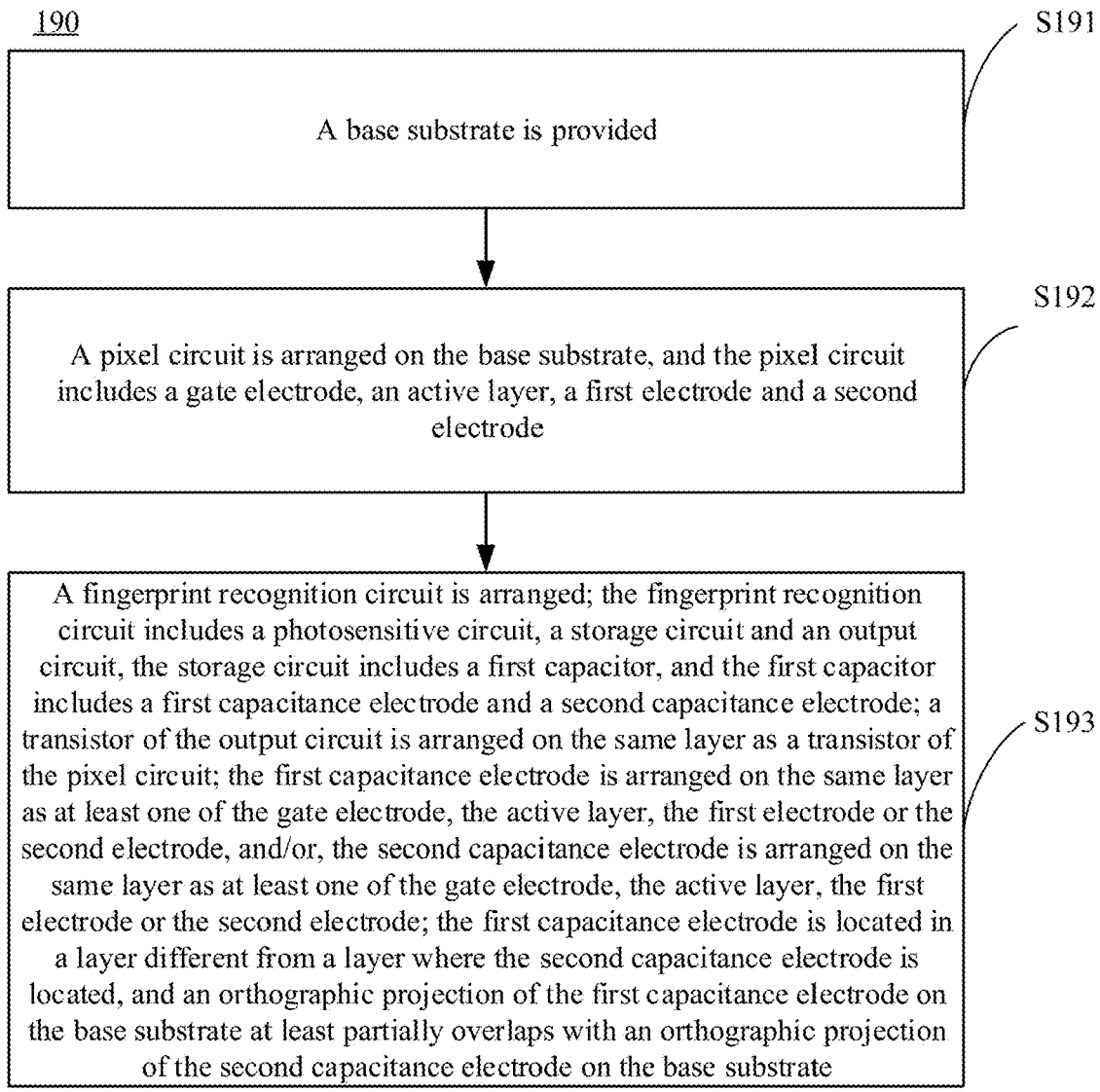
FIG. 19 is a flowchart of a method for manufacturing a display panel according to an embodiment of the present disclosure.

FIG. 19 is a flowchart of a method for manufacturing a display panel according to an embodiment of the present disclosure.

As shown in FIG. 19, the method 190 for manufacturing a display panel may include operations S191 to S193.

In operation S191, a base substrate is provided.

In operation S192, a pixel circuit is arranged on the base substrate, and the pixel circuit includes a gate electrode, an active layer, a first electrode and a second electrode.

In operation S193, a fingerprint recognition circuit is arranged; the fingerprint recognition circuit includes a photosensitive circuit, a storage circuit and an output circuit, the storage circuit includes a first capacitor, and the first capacitor includes a first capacitance electrode and a second capacitance electrode; a transistor of the output circuit is arranged in the same layer as a transistor of the pixel circuit.

The photosensitive circuit is configured to convert a received optical signal into an electrical signal, the storage circuit is configured to store the electrical signal, and the output circuit includes a control switch configured to control the photosensitive circuit to charge the storage circuit in an off state and output at least the stored electrical signal in a closed state, so as to perform a fingerprint recognition based on the outputted electrical signal.

The first capacitance electrode is arranged in the same layer as at least one of the gate electrode, the active layer, the first electrode or the second electrode, and/or the second capacitance electrode is arranged in the same layer as at least one of the gate electrode, the active layer, the first electrode or the second electrode; the first capacitance electrode is located in a layer different from a layer where the second capacitance electrode is located, and an orthographic projection of the first capacitance electrode on the base substrate at least partially overlaps with an orthographic projection of the second capacitance electrode on the base substrate.

In some embodiments, the first capacitance electrode and the second capacitance electrode are manufactured as follows.

First, a fifth metal layer is formed, and the fifth metal layer is patterned to form a first capacitance electrode and a first gate line.

Then, a second gate dielectric layer is formed.

Next, a sixth metal layer is formed, and the sixth metal layer is patterned to form a second capacitance electrode and a second gate line; a first width of a cross section of the first capacitance electrode perpendicular to an extension direction of the first gate line is greater than a second width of a cross section of the second capacitance electrode perpendicular to an extension direction of the second gate line.

Then, an interlayer dielectric layer is formed, and a via hole is formed in a region where a projection of the first capacitance electrode on the base substrate and a projection of the second capacitance electrode on the base substrate do not overlap, so as to expose the first capacitance electrode.

Next, the first electrode is formed so that the first capacitance electrode and the first electrode are electrically connected.

In a specific embodiment, the existing first gate line gate1, second gate line gate2, heavily-doped poly Si, first source/drain SD1, second source/drain electrode SD2 and other film layers of an OLED structure are reused as two electrodes of a newly added capacitor, and a first gate dielectric layer GI1 is used as an insulating layer of the newly added capacitor. Reusing the existing first gate line gate1 and second gate line gate2 metal of the OLED structure as two electrodes of the newly added capacitor is described as an example. The gate1 is connected to SD1 connected to a lower electrode side of the PIN photodiode through a via hole, the gate2 may be connected to a normal voltage signal alone, or may be connected to an anode layer through a via hole so as to be connected to a Vbias signal, and a second gate dielectric layer GI2 is used as an insulating layer of a capacitor, and the plan design views are shown in FIG. 11 and FIG. 12.

In some embodiments, the first capacitance electrode and the second capacitance electrode may be manufactured as follows.

First, an active layer is formed.

Then, the active layer is patterned to form a patterned active layer, the patterned active layer includes a first pattern region and a second pattern region electrically connected, the first pattern region corresponds to an active region of the transistor of the output circuit, and the pattern region corresponds to the first capacitance electrode.

Next, a first gate dielectric layer, a first gate line, a second gate dielectric layer and a seventh metal layer are sequentially formed.

Then, the seventh metal layer is patterned to form the second capacitance electrode and a second gate line.

In a specific embodiment, reusing the existing heavily-doped poly Si layer (having a conductivity) and second gate line gate2 metal in the OLED structure as two electrodes of the newly added capacitor is described as an example. The heavily-doped poly Si connected to a lower electrode side of the PIN photodiode is in a conductive state and may be used as a side electrode plate of the newly added capacitor. The second gate line gate2 may be connected to a normal voltage signal alone, or may be connected to an anode layer through a via hole so as to be connected to a Vbias signal. The first gate dielectric layer GI1 and the second gate dielectric layer GI2 are used as insulating layers of the newly added capacitor, and the plan design views are shown in FIG. 14 and FIG. 15.

The above-mentioned two embodiments are suitable for use when a design space allows. any two layers of masks such as a heavily-doped poly Si layer, gate1, gate2, a SD1, SD2 layer, etc. may be reused, and multi-layer capacitors may be formed in parallel, so that no new process is added and no thickness and cost is increased.

The process flow of the above-mentioned two embodiments may be as follows. First, a buffer layer buffer insulating layer is deposited. Next, a deposition, a crystallization, and a photolithography of polysilicon are performed to form a polysilicon pattern. Next, a deposition of a GI1 insulating layer is performed, and then a deposition and a photolithography of a gate1 layer are performed to form a pattern. Next, polysilicon is doped to form a channel. Then, a deposition of a GI2 insulating layer, a deposition and a photolithography of a gate2 layer, and a deposition and a photolithography of an ILD insulating layer are performed.

The GI1, GI2 and ILD are etched together to form a via hole connected to polysilicon or the gate1 or the gate2. Next, a deposition and a photolithography of an SD1 layer are performed to form a TFT structure. Then, a deposition of PVX1, and a gluing, an exposure and a development of PLN1 are performed. Then, a deposition and a photolithography of PVX2 are performed. The PVX1 and PVX2 are etched together. Next, a deposition and a photolithography of SD2 are performed to form a lower electrode of PIN. Then, a deposition, a gluing, an exposure and a development of N—Si, I—Si, P—Si and an upper electrode ITO of the PIN are performed, and the ITO is etched and the PIN is etched. A cover layer is then deposited. Then, a gluing, an exposure and a development of PLN2 are performed. Next, a deposition and a photolithography of the anode are performed. Next, a vapor deposition of EL and a gluing, and an exposure, and a development of PDL are performed. Then, a photolithography of PS, a deposition of a cathode, and a deposition of an encapsulation layer are performed.

The embodiment may have the following advantages: for example, more feasible ways to form a capacitor are provided, especially heavily-doped poly Si is used as a side electrode of a capacitor. For example, one side of the capacitor is connected to a negative electrode of the PIN, and the other side may be connected to a normal voltage signal, and a voltage difference between both sides of the capacitor may be adjusted according to the quantity of charges generated by the PIN, which may improve a storage capacity for the quantity of charges and meet a fingerprint recognition detection under strong light of the PIN. For example, an increase in an upper limit of a storage capacity of the capacitor may increase a brightness of backlight without causing a saturation of the PIN when the backlight is allowed to be used for testing, which may further increase a signal volume and improve a signal-to-noise ratio. For example, the number of capacitors for each sensing pixel may be one, or a plurality of capacitors combined with multi-layer metal layers may be connected in parallel, which may improve a problem of insufficient capacitors caused by an insufficient available area of a pixel circuit of a certain layer.

In some embodiments, the first capacitance electrode and the second capacitance electrode are manufactured as follows.

First, an eighth metal layer is formed.

Then, the eighth metal layer is patterned to form a patterned eighth metal layer, the patterned eighth metal layer includes a third pattern region and a fourth pattern region electrically connected, the third pattern region corresponds to a first electrode of the transistor of the output circuit, and the fourth pattern region corresponds to the first capacitance electrode.

Next, a photosensitive circuit, a dielectric layer and a ninth metal layer are sequentially formed. The photosensitive circuit may be formed by a thin film process, a photolithography process and an etching process. For example, a P-pole/I-pole/N-pole laminated layer of the PIN photodiode is formed first, and then the PIN photodiode is formed by a photolithography process and an etching process.

Then, the ninth metal layer is patterned to form a second capacitance electrode.

A metal layer and an insulating layer are newly added above a cover insulating layer on the PIN photodiode, the second source/drain electrode SD2 is used as a lower electrode of the newly added capacitor, the cover insulating layer is used as an insulating layer of the newly added capacitor, and a newly added metal layer is used as an upper electrode of the capacitor. The upper electrode may be connected to a normal voltage signal alone. The upper electrode may also be connected to an anode layer through a via hole so as to be connected to a Vbias signal. Referring to FIG. 16 to FIG. 18, the technical solution is suitable to be implemented under a condition of an insufficient design space. The advantage of the method is that a film layer of the newly added capacitor is far away from a sensing and display TFT circuit, which has a low noise impact on a crosstalk between display and a sensing capacitors. It should be noted that a material of the newly added metal layer may be Mo, Ti/Al/Ti, Mo/Al/Mo, ITO and other metal materials, and a metal thickness may be changed from 300 Å to 5000 Å. It should be noted that the embodiment in which no new metal layer is added and the embodiment in which a new metal layer is added may be compatible with each other, and may be used at the same time.

Specifically, the process flow in which a new metal layer needs to be added adds a metal layer and an insulating layer PVX3 compared to the process in which no new metal layer needs to be added. However, the number of exposures is only increased by 1. Specifically, a buffer insulating layer may be deposited first. Next, a deposition, a crystallization, and a photolithography of polysilicon are performed to form a polysilicon pattern. Next, a deposition of a first gate dielectric layer GI1 insulating layer is performed. Then, a deposition and a photolithography of a first gate line gate1 layer are performed to form a pattern. Next, polysilicon is doped to form a channel. Then, a deposition of a second gate dielectric layer GI2 insulating layer, a deposition and a photolithography of a second gate line gate2 layer, and a deposition and a photolithography of an ILD insulating layer are performed. The GI1, GI2 and ILD are etched together to form a via hole connected to polysilicon or the gate1 or the gate2. Next, a deposition and a photolithography of an SD1 layer are performed to form a TFT structure. Then, a deposition of PVX1, and a gluing, an exposure and a development of PLN1 are performed. Then, a deposition and a photolithography of PVX2 are performed. The PVX1 and PVX2 are etched together. Next, a deposition and a photolithography of SD2 is performed to form a lower electrode of PIN. Then, a deposition, a gluing, an exposure and a development of N—Si, I—Si, P—Si, and an upper electrode indium tin oxide ITO of the PIN photodiode are performed, and the ITO is etched and the PIN is etched. A cover layer is deposited. Next, a deposition and a photolithography of a metal layer are performed to form a pattern, which is used as an upper electrode plate of the newly added capacitor. Then, a deposition and a photolithography of an insulating layer PVX3 is performed, and a cover and PVX3 are etched together. Then, a gluing, an exposure and a development of PLN2 are performed. Then, a deposition and a photolithography of an anode are performed. Next, a vapor deposition of EL, and a gluing, an exposure and a development of PDL are performed. Then, a photolithography of PS, a deposition of a cathode, and a deposition of an encapsulation layer are performed.

Compared with the embodiment in which no new metal layer needs to be added, the embodiment has the following advantages: for example, two electrodes of the newly added capacitor are far away from a TFT and signal trace of a display and sensor below with two layers of PVX and a thicker resin layer therebetween. Therefore, there is a less crosstalk effect on the display and sensing signal traces below. The embodiment may reduce an influence of a sensor on a display, and also reduce noise generated by the sensor affected by the display. For example, the added metal layer may be designed with a larger area, which may form a relatively large capacitor, and may greatly improve the anti-strong light capability. At the same time, a brightness of backlight may be allowed to be increased during a test process, which may greatly improve a sensing signal-to-noise ratio. For example, one electrode of the newly added capacitor is connected to a negative electrode of the PIN photodiode, and the other electrode may be connected to a normal voltage signal. A voltage difference between both sides of the capacitor is adjusted according to the quantity of charges generated by the PIN photodiode, which may improve a storage capacity for the quantity of charges and meet a fingerprint recognition detection under strong light of the PIN. For example, an increase of an upper limit of a storage capacity of the newly added capacitor may increase a brightness of backlight without causing a saturation of the storage capacity of the PIN photodiode when the backlight is allowed to be used for testing, which may further increase a signal volume and improve a signal-to-noise ratio.

In some embodiments, the above-mentioned method for manufacturing a display panel may further include the following operations: forming at least one second capacitor connected in parallel with the first capacitor, wherein each of the at least one second capacitor includes a third electrode and a fourth electrode; a manufacturing method of the third electrode and the fourth electrode is the same as that of the first capacitance electrode and the second capacitance electrode.

The embodiments of the present disclosure provide an OLED structure capable of improving an anti-strong light capability of an in-cell fingerprint recognition sensor. By adding one or more new capacitors outside a PIN position, one electrode of the capacitor is connected to a negative electrode of the PIN photodiode, and the other electrode may be connected to a normal voltage signal or a Vbias signal, which may improve a storage capacity for high charges generated by the PIN photodiode in a strong light environment and effectively improve a problem of saturation of the PIN photodiode in an OLED in-cell fingerprint recognition under strong outdoor light. In addition, an increase of an upper limit of the stored charge quantity may further increase an upper limit of a signal volume, which is beneficial to an improvement of a signal-to-noise ratio.

The embodiments of the present disclosure provide a structure design method of an OLED display panel. For example, if a design space allows, the existing gate1, gate2, heavily-doped poly Si, SD1, SD2 and other film layers in the OLED structure are reused as two electrodes of the newly added capacitor, and GI is used as an insulating layer, so that no new process is added and no cost is increased. For example, when the design space is insufficient, it is necessary to newly add a metal layer and an insulating layer, and a cover layer is not subjected to photolithography alone, but together with the newly added insulating layer. Therefore, only one photolithography mask needs to be added, and a lower electrode SD2 of the PIN photodiode and the newly added metal layer are used as two electrodes of the capacitor. The above-mentioned method may improve the problem of saturation of the PIN photodiode in an OLED in-cell fingerprint recognition under strong outdoor light, and improve an anti-srong light performance and a signal-to-noise ratio.

Another aspect of the present disclosure further provides a display device including the display panel as described above.

Figure 20:
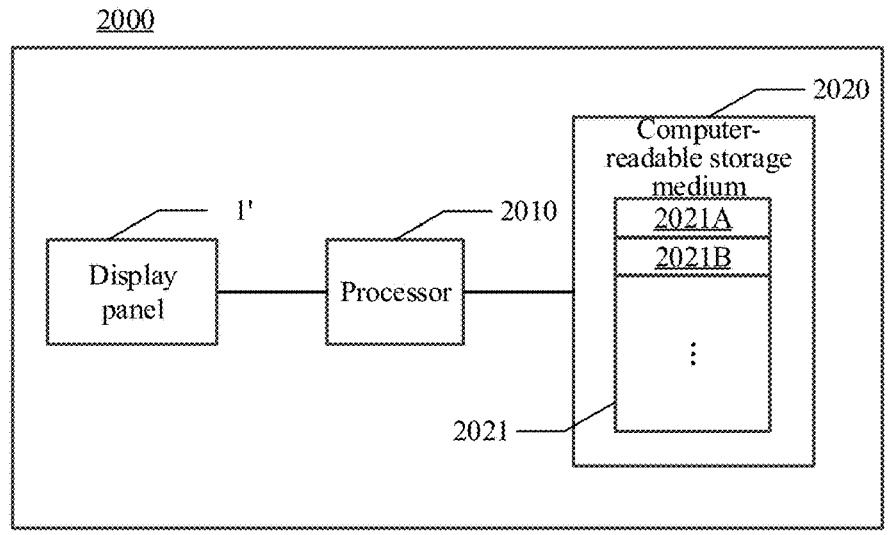
FIG. 20 is a block diagram of an electronic device according to an embodiment of the present disclosure.

FIG. 20 is a block diagram of an electronic device according to an embodiment of the present disclosure.

As shown in FIG. 20, the electronic device 2000 includes one or more display panels 1, 1' as described above.

In some embodiments, as shown in FIG. 1 and FIG. 2, the display panel 1' further includes: a light-emitting element arranged in a light-emitting region, and the light-emitting element includes: an anode; the anode is coupled to a drain electrode of a thin film transistor of a pixel drive circuit.

Light emitted by a light-emitting element D exits through a base substrate; an orthographic projection of a portion of a gate electrode drive circuit 13 located in a display region 10 on the base substrate does not overlap an orthographic projection of the light-emitting element D and a pixel drive circuit 12 on the base substrate.

When the light emitted by the light-emitting element D exits through the base substrate, the display panel 1' is a bottom-emission type display panel. When the orthographic projection of the portion of the gate electrode drive circuit 13 located in the display region 10 on the base substrate do not overlap the orthographic projection of the light-emitting element D and the pixel drive circuit 12 on the base substrate, the gate electrode drive circuit 13 may not affect an aperture ratio of the display panel 1'. A region where the gate electrode drive circuit 13 is located is a non-light-emitting region, and a region where the light-emitting element D is located is a light-emitting region.

In some embodiments, an orthographic projection of a non-light-emitting region where the pixel drive circuit 12 is located on the base substrate does not overlap with an orthographic projection of the light-emitting region where the light-emitting element D is located on the base substrate.

In some embodiments, an orthographic projection of a region where the pixel drive circuit 12 is located on the base substrate partially overlaps the orthographic projection of the light-emitting region where the light-emitting element D is located on the base substrate. A material of two electrode plates of a storage capacitor in the pixel drive circuit 12 is, for example, a transparent conductive material, and the material of one electrode plate is the same as that of a first active layer, that is, indium gallium zinc oxide. The electrode plate may be prepared simultaneously with the first active layer, so that the number of masks may be reduced; the material of the other electrode plate is, for example, indium tin oxide (ITO). An orthographic projection of the storage capacitor on the base substrate overlaps the orthographic projection of the light-emitting element D on the base substrate. In the structure, since the two electrode plates of the storage capacitor are transparent, the storage capacitor may be located in the light-emitting region, and a region where other portions of the pixel drive circuit 12 except the storage capacitor are located is a non-light-emitting region. When the storage capacitor is located in the light-emitting region, the aperture ratio of the display panel 1' may be increased.

For example, each pixel unit includes 4 sub-pixels P, and an arrangement order of emission colors of the 4 sub-pixels P is, for example, red, green, blue and any combination of colors, such as green, blue or white (W). When matched with white, an arrangement of the sub-pixels P of the structure may improve a brightness of the pixel unit, thereby helping to improve a display effect of the display panel 1'.

In some embodiments, light emitted by the light-emitting element D emits toward a side away from the base substrate. The display panel 1' of the structure is a top-emission type display panel. In the top-emission display panel, the orthographic projection of the portion of the gate electrode drive circuit 13 located in the display region 10 on the base substrate may overlap the orthographic projection of the light-emitting element D and the pixel drive circuit 12 on the base substrate, which may not affect the aperture ratio of the display panel 1'.

Regardless of whether the display panel 1' is a bottom-emission type display panel or a top-emission type display panel, the structure of the display panel 1' is, for example, as shown in FIG. 11. In a thickness direction of the display panel 1', the display panel 1' includes a light shielding layer, a buffer layer, a thin film transistor, an anode and a flat layer on the base substrate. The thin film transistor is a drive transistor T3 in the pixel drive circuit 12, and the thin film transistor includes, for example, a first active layer, a first gate insulating layer, a gate electrode, an interlayer insulating layer, a source/drain layer (SD layer), and a passivation layer.

A material of the light shielding layer is, for example, a light shielding material, such as a black matrix material, or a metal material. In FIG. 11, taking the metal material as an example, the light shielding layer needs to be coupled with the SD layer to form a structure similar to upper and lower double channels, thereby improving electrical performances of the thin film transistor. The light shielding layer is configured to prevent light incident from the base substrate from affecting the first active layer, thereby affecting performances of the thin film transistor.

A material of the first active layer is, for example, metal oxide, polycrystalline silicon, or amorphous silicon; the metal oxide is, for example, indium gallium zinc oxide.

A material of the gate electrode is, for example, a metal material, such as molybdenum, titanium, copper, silver, and aluminum, and a structure thereof is, for example, a single-layer structure.

In some embodiments, a cathode includes a transparent conductive material, and an anode includes a metal material. The metal material may be a material with a high conductivity and a high reflectivity, so that when light emitted from a light-emitting layer 141 faces a side of the substrate, the light is reflected by the anode to a top portion of the pixel unit for light emission, which may help to improve a light emission efficiency and reduce an energy consumption.

A material of the SD layer is, for example, a metal material, such as molybdenum, titanium, copper, silver, aluminum and other metal materials, and a structure thereof may be a single-layer structure or a laminated structure. For example, a conductive layer of a source-drain electrode material may be Ti/Al/Ti, etc.

Specifically, a gate electrode material may include metal materials, such as Mo, Al, Cu and other metals and alloys thereof. The source/drain electrode material may include metal materials, such as Mo, Al, Cu and other metals and alloys thereof. A semiconductor material constituting the active layer may include, for example, amorphous silicon, polysilicon, oxide semiconductor, etc., and an oxide semiconductor material may include, for example, IGZO (indium gallium zinc oxide), ZnO (zinc oxide), etc.

Materials of the buffer layer, the first gate insulating layer, the interlayer insulating layer and the passivation layer are, for example, all inorganic insulating materials, such as at least one of silicon oxide (SiOx) and silicon nitride (SiN).

A material of the anode is, for example, a conductive material, such as ITO, which may be a single-layer structure or a laminated structure.

A material of the flat layer is, for example, an organic substance, such as polyimide (PI), and the flattening layer plays a flattening role.

The gate electrode may take double-layer traces (e.g., a first gate line g1 and a second gate line g2) in a GIA region, which may reduce a resistance (RC) of a first conductive sub-layer.

In addition, the display device 2000 may include one or more processors 2010 and a computer-readable storage medium 2020.

Specifically, the processor 2010 may include, for example, a general-purpose microprocessor, an instruction set processor and/or a related chipset and/or a dedicated-purpose microprocessor (e.g., an application specific integrated circuit (ASIC)), etc. The processor 2010 may also include an on-board memory for a caching purpose.

The computer-readable storage medium 2020 may be, for example, a non-volatile computer-readable storage medium, and specific examples include, but are not limited to: a magnetic storage device, such as a magnetic tape or hard disk (HDD); an optical storage device, such as a compact disk (CD-ROM); a memory, such as a random access memory (RAM) or flash memory, etc.

The computer-readable storage medium 2020 may include a program 2021. The program 2021 may include code/computer-executable instructions which, when executed by a processor 2010, cause the processor 2010 to perform an image display data processing. For example, in an exemplary embodiment, a code in the program 2021 may include one or more program modules, including, for example, a program module 2021A, a program module 2021B . . . .

The above-mentioned display device may include any device or product having a display function. For example, the above-mentioned display device may be a smart phone, a mobile phone, an e-book reader, a desktop computer (PC), a laptop PC, a netbook PC, a personal digital assistant (PDA), a portable multimedia player (PMP), a digital audio player, a mobile medical device, a camera, a wearable device (such as a head-mounted device, an electronic apparel, an electronic wristband, an electronic necklace, an electronic accessory, an electronic tattoo, or a smart watch), a television, etc.

Although the present disclosure has been described with reference to the accompanying drawings, the embodiments disclosed in the accompanying drawings are intended to illustrate the embodiments of the present disclosure and should not be construed as limiting the present disclosure. Size ratios in the accompanying drawings are only schematic and should not be construed as limiting the present disclosure.

The above are only specific embodiments of the present disclosure. However, the scope of protection of the present disclosure is not limited thereto. Changes or replacements thought by any person skilled in the art within the technical scope disclosed in the present disclosure should be included in the scope of protection of the present disclosure. Therefore, the scope of protection of the present disclosure should be based on the scope of protection of the claims.

What is claimed is:

1. A display panel, comprising:
a base substrate;
a pixel circuit arranged on the base substrate, wherein the pixel circuit comprises a transistor, and the transistor of the pixel circuit comprises an active layer, a gate electrode, a first electrode and a second electrode; and
a fingerprint recognition circuit, wherein the fingerprint recognition circuit comprises a photosensitive circuit, a storage circuit and an output circuit, the storage circuit comprises a first capacitor, and the first capacitor comprises a first capacitance electrode and a second capacitance electrode;
wherein the photosensitive circuit is configured to convert a received optical signal into an electrical signal, the storage circuit is configured to store the electrical signal, and the output circuit comprises a control switch configured to control the photosensitive circuit to charge the storage circuit in an off state and output at least the stored electrical signal in a closed state, so as to perform a fingerprint recognition based on the output electrical signal;
wherein the first capacitance electrode is arranged in the same layer as at least one of the gate electrode, the active layer, the first electrode or the second electrode, and/or, the second capacitance electrode is arranged in the same layer as at least one of the gate electrode, the active layer, the first electrode or the second electrode; the first capacitance electrode is located in a layer different from a layer where the second capacitance electrode is located, and an orthographic projection of the first capacitance electrode on the base substrate at least partially overlaps with an orthographic projection of the second capacitance electrode on the base substrate,
wherein the gate electrode comprises a first gate line and a second gate line, and the first gate line is located in a layer different a layer where the second gate line is located; and
the first capacitance electrode is arranged in the same layer as the first gate line, and the second capacitance electrode is arranged in the same layer as the second gate line; or the first capacitance electrode is arranged in the same layer as the second gate line, and the second capacitance electrode is arranged in the same layer as the first gate line.

2. The display panel according to claim 1, further comprising:
a first gate dielectric layer arranged between the active layer and the first gate line;
a second gate dielectric layer arranged between the first gate line and the second gate line; and
an interlayer dielectric layer arranged on a side of the second gate dielectric layer away from the base substrate.

3. The display panel according to claim 2, wherein
the first capacitance electrode is connected to the first electrode through a first via hole, and the first via hole is arranged in the second gate dielectric layer and the interlayer dielectric layer; or
the second capacitance electrode is connected to the first electrode through a second via hole, the second via hole is arranged in the interlayer dielectric layer, and the second via hole exposes the second capacitance electrode.

4. The display panel according to claim 1, wherein the gate electrode comprises a first gate line and a second gate line, and the first gate line is located in a layer different a layer where the second gate line is located; and
the first capacitance electrode is arranged in the same layer as the first gate line or the second gate line, and the second capacitance electrode is arranged in the same layer as the active layer.

5. The display panel according to claim 1, wherein:
the first capacitance electrode is arranged in the same layer as at least one of the gate electrode, the active layer or the first electrode, the second capacitance electrode is arranged in a first metal layer, and the first metal layer is located in a layer different from a layer where the gate electrode, the active layer and the first electrode are respectively located; or the second capacitance electrode is arranged in the same layer as at least one of the gate electrode, the active layer or the first electrode, the first capacitance electrode is arranged on a second metal layer, and the second metal layer is located in a layer different from a layer where the gate electrode, the active layer and the first electrode are respectively located.

6. The display panel according to claim 5, wherein the first capacitance electrode is arranged in the same layer as the first electrode, the second capacitance electrode is arranged on a side of the photosensitive circuit away from the base substrate, and a distance exists between the orthographic projection of the second capacitance electrode on the base substrate and an orthographic projection of the photosensitive circuit on the base substrate.

7. The display panel according to claim 6, further comprising:
an interlayer dielectric layer arranged on a side of the gate electrode away from the base substrate; and
an insulating layer, wherein a first thickness of the insulating layer is greater than a second thickness of the interlayer dielectric layer;
wherein the first electrode comprises:
a first sub-electrode arranged on a side of the interlayer dielectric layer away from the base substrate; and
a second sub-electrode arranged on a side of the first sub-electrode away from the base substrate, wherein the insulating layer is arranged between the first sub-electrode and the second sub-electrode; and
wherein the photosensitive circuit is arranged on a side of the second sub-electrode away from the base substrate.

8. The display panel according to claim 1, wherein the storage circuit further comprises at least one second capacitor connected in parallel with the first capacitor, and each of the at least one second capacitor comprises a third electrode and a fourth electrode.

9. The display panel according to claim 8, wherein the third electrode is arranged in the same layer as at least one of the gate electrode, the active layer or the first electrode, the fourth electrode is arranged in a third metal layer, and the third metal layer is located in a layer different from a layer where the gate electrode, the active layer and the first electrode are respectively located; or
the fourth electrode is arranged in the same layer as at least one of the gate electrode, the active layer or the first electrode, the third electrode is arranged in a fourth metal layer, and the fourth metal layer is located in a layer different from a layer where the gate electrode, the active layer and the first electrode are respectively located.

10. The display panel according to claim 8, wherein the gate electrode comprises a first gate line and a second gate line, and the first gate line is located in a layer different from a layer where the second gate line is located; the third electrode is arranged in the same layer as the first gate line or the second gate line, the fourth electrode is arranged in the same layer as the first gate line or the second gate line, and the third electrode is located in a layer different from a layer where the fourth electrode is located.

11. The display panel according to claim 1, further comprising:
a plurality of pixel units arranged on the base substrate, wherein the plurality of pixel units are arranged on the base substrate in an array, and an orthographic projection of the pixel units on the base substrate overlaps with an orthographic projection of the photosensitive circuit on the base substrate.

12. The display panel according to claim 11, wherein the pixel unit comprise at least one sub-pixel, each sub-pixel comprises a light-emitting element, and the light-emitting element comprises an anode; and
the pixel circuit comprises a sub-pixel drive circuit, and a first electrode of a transistor of the sub-pixel drive circuit is connected to the anode.

13. The display panel according to claim 12, wherein the output circuit comprises a first transistor, and the sub-pixel drive circuit comprises at least one second transistor; wherein,
a first electrode of the first transistor is arranged in the same layer as a first electrode of the second transistor; and/or
a gate electrode of the first transistor is arranged in the same layer as a gate electrode of the second transistor; and/or
an active layer of the first transistor is arranged in the same layer as an active layer of the second transistor.

14. The display panel according to claim 1, wherein the photosensitive circuit comprises a PIN photodiode,
wherein the display panel further comprises:
a transparent conductive layer arranged on a side of the PIN photodiode away from the base substrate, wherein the transparent conductive layer is connected to a bias voltage lead-in electrode.

15. A display device comprising the display panel according to claim 1.

16. A method for manufacturing a display panel, comprising:
providing a base substrate;
arranging a pixel circuit on the base substrate, wherein the pixel circuit comprises a gate electrode, an active layer, a first electrode and a second electrode; and
arranging a fingerprint recognition circuit; wherein the fingerprint recognition circuit comprises a photosensitive circuit, a storage circuit and an output circuit, the storage circuit comprises a first capacitor, and the first capacitor comprises a first capacitance electrode and a second capacitance electrode; a transistor of the output circuit is arranged in the same layer as a transistor of the pixel circuit;
wherein the photosensitive circuit is configured to convert a received optical signal into an electrical signal, the storage circuit is configured to store the electrical signal, and the output circuit comprises a control switch configured to control the photosensitive circuit to charge the storage circuit in an off state and output at least the stored electrical signal in a closed state, so as to perform a fingerprint recognition based on the output electrical signal;
wherein the first capacitance electrode is arranged in the same layer as at least one of the gate electrode, the active layer, the first electrode or the second electrode, and/or, the second capacitance electrode is arranged in the same layer as at least one of the gate electrode, the active layer, the first electrode or the second electrode; the first capacitance electrode is located in a layer different from a layer where the second capacitance electrode is located, and an orthographic projection of the first capacitance electrode on the base substrate at least partially overlaps with an orthographic projection of the second capacitance electrode on the base substrate, wherein the first capacitance electrode and the second capacitance electrode are manufactured by:
forming a fifth metal layer, and patterning the fifth metal layer to form the first capacitance electrode and a first gate line;
forming a second gate dielectric layer;
forming a sixth metal layer, and patterning the sixth metal layer to form the second capacitance electrode and a second gate line; wherein a first width of a cross section of the first capacitance electrode perpendicular to an extension direction of the first gate line is greater than a second width of a cross section of the second capacitance electrode perpendicular to an extension direction of the second gate line;
forming an interlayer dielectric layer, and forming a via hole in a region where a projection of the first capacitance electrode on the base substrate and a projection of the second capacitance electrode on the base substrate do not overlap, so as to expose the first capacitance electrode; and
forming the first electrode so that the first capacitance electrode and the first electrode are electrically connected, or
wherein the first capacitance electrode and the second capacitance electrode are manufactured by:
forming the active layer;
patterning the active layer to form a patterned active layer, wherein the patterned active layer comprises a first pattern region and a second pattern region electrically connected, the first pattern region corresponds to an active layer of the transistor of the output circuit, and the second pattern region corresponding to the first capacitance electrode;
sequentially forming a first gate dielectric layer, a first gate line, a second gate dielectric layer and a seventh metal layer; and
patterning the seventh metal layer to form the second capacitance electrode and a second gate line, or
wherein the first capacitance electrode and the second capacitance electrode are manufactured by:
forming an eighth metal layer;
patterning the eighth metal layer to form a patterned eighth metal layer, wherein the patterned eighth metal layer comprises a third pattern region and a fourth pattern region electrically connected, the third pattern region corresponds to a first electrode of the transistor of the output circuit, and the fourth pattern region corresponds to the first capacitance electrode;
sequentially forming a photosensitive circuit, a dielectric layer and a ninth metal layer; and
patterning the ninth metal layer to form the second capacitance electrode.

17. The method according to claim 16, further comprising:
forming at least one second capacitor connected in parallel with the first capacitor, wherein each of the at least one second capacitor comprises a third electrode and a fourth electrode; a manufacturing method of the third electrode and the fourth electrode is the same as that of the first capacitance electrode and the second capacitance electrode.

* * * * *